(12) United States Patent
Satoh

(10) Patent No.: US 11,031,491 B2
(45) Date of Patent: Jun. 8, 2021

(54) SEMICONDUCTOR DEVICE

(71) Applicant: Mitsubishi Electric Corporation, Tokyo (JP)

(72) Inventor: Katsumi Satoh, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/507,316

(22) Filed: Jul. 10, 2019

(65) Prior Publication Data

US 2020/0098903 A1 Mar. 26, 2020

(30) Foreign Application Priority Data

Sep. 25, 2018 (JP) .............................. JP2018-178887

(51) Int. Cl.
*H01L 29/739* (2006.01)
*H01L 29/06* (2006.01)
*H01L 27/06* (2006.01)

(52) U.S. Cl.
CPC ...... *H01L 29/7397* (2013.01); *H01L 27/0623* (2013.01); *H01L 29/0619* (2013.01)

(58) Field of Classification Search
None
See application file for complete search history.

(56) References Cited

U.S. PATENT DOCUMENTS

| 8,168,480 | B2* | 5/2012 | Lin ..................... H01L 29/0834 438/140 |
| 9,054,707 | B2* | 6/2015 | Blanchard ............... H01L 29/16 |
| 9,059,710 | B2* | 6/2015 | Blanchard .............. H03K 3/012 |
| 10,355,078 | B2* | 7/2019 | Kono ................. H01L 29/1608 |
| 2011/0062514 | A1* | 3/2011 | Takano ............... H01L 29/0696 257/334 |
| 2020/0098903 | A1* | 3/2020 | Satoh ................. H01L 29/7397 |

FOREIGN PATENT DOCUMENTS

| JP | 2010-123667 A | 6/2010 |
| JP | 2013-175728 A | 9/2013 |

* cited by examiner

*Primary Examiner* — Long Pham
(74) *Attorney, Agent, or Firm* — Studebaker & Brackett PC

(57) ABSTRACT

A normally-off first gate channel region is provided on a first main surface side, in a region in a p base between an n base and an n emitter connected to an emitter electrode. On and off of the first gate channel region is controlled by a voltage of a first gate electrode. A normally-on second gate channel region is provided on a second main surface side, by an n-type region between an n collector electrically connected to a collector electrode and the n base. On and off of the second gate channel region is controlled by a voltage of a second gate electrode.

23 Claims, 29 Drawing Sheets

FIG.2

| OPERATION MODE | Vce | Vg1 | Vg2 | STATE |
|---|---|---|---|---|
| 1 | + | 0 | 0 | OFF(VOLTAGE BLOCK) |
| 2 | + | + | 0 | FORWARD CURRENT CONDUCTION(C→E) |
| 3 | + | + | + | FORWARD CURRENT CONDUCTION(C→E) |
| 4 | + | 0 | + | OFF(VOLTAGE BLOCK) |
| 5 | − | 0 | 0 | OFF(VOLTAGE BLOCK) |
| 6 | − | + | 0 | OFF(VOLTAGE BLOCK) |
| 7 | − | + | + | REVERSE CURRENT CONDUCTION(E→C) |
| 8 | − | 0 | + | REVERSE CURRENT CONDUCTION(E→C) |

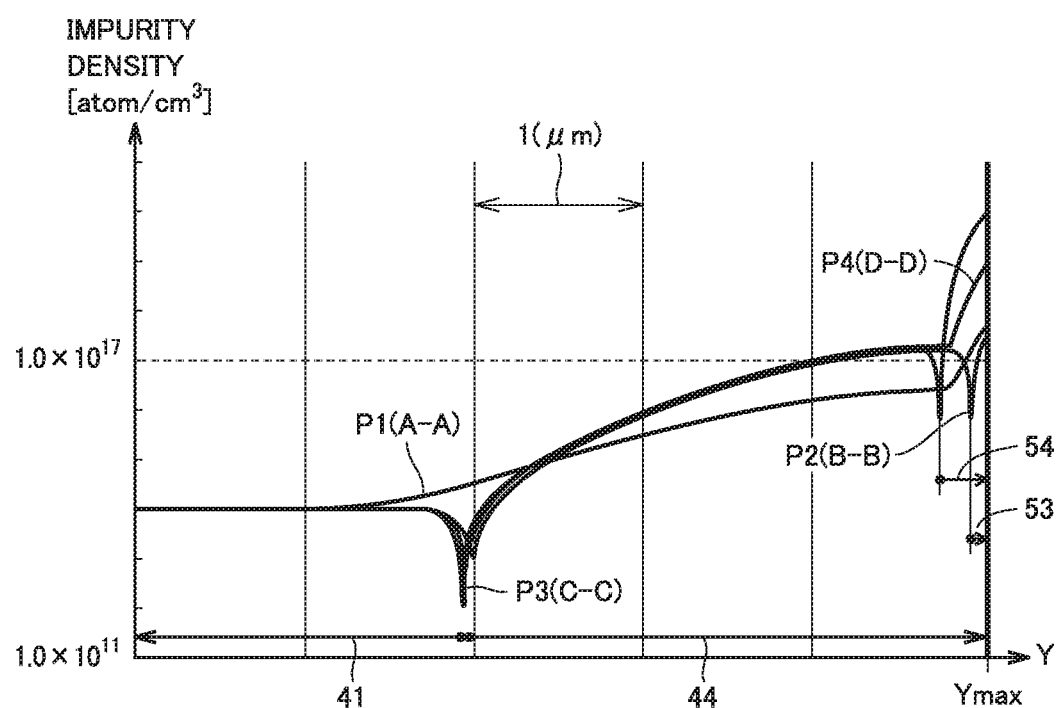

FIG.17

| | TIME OF DELAY Td OF VARIATION IN SECOND GATE VOLTAGE ($-\beta \rightarrow 0$) AFTER VARIATION IN FIRST GATE VOLTAGE ($\alpha \rightarrow 0$) | | | | |
|---|---|---|---|---|---|
| Tj | 0 | +3($\mu$s) | +1($\mu$s) | −1($\mu$s) | −3($\mu$s) |
| 25°C (Vsg) | FIG.18 (400V) | FIG.19 (250V) | FIG.20 (300V) | FIG.21 (400V) | FIG.22 (400V) |
| 150°C (Toff) | FIG.23 (0.55 $\mu$s) | FIG.24 (0.75 $\mu$s) | FIG.25 (0.6 $\mu$s) | FIG.26 (0.4 $\mu$s) | FIG.27 (0.45 $\mu$s) |

SEMICONDUCTOR DEVICE

BACKGROUND OF THE INVENTION

Field of the Invention

The present invention relates to a semiconductor device and more particularly to a semiconductor device with a double-gate structure.

Description of the Background Art

A semiconductor device in which a plurality of control electrodes control a state of conduction (on) and a state of non-conduction (off) between main electrodes has been known. For example, Japanese Patent Laying-Open No. 2013-175728 describes a semiconductor device including a first current controller (a control electrode) and a second current controller (a control electrode) arranged between a first main electrode and a second main electrode, the first current controller being configured to control a current input to and output from the first main electrode, the second current controller being configured to control a current input to and output from the second main electrode, both of the first current controller and the second current controller being configured to control both of an electronic current and a hole current. The semiconductor device described in Japanese Patent Laying-Open No. 2013-175728 has a super-junction structure and can implement a semiconductor bidirectional switching element capable of bidirectional switching.

SUMMARY OF THE INVENTION

As described also in Japanese Patent Laying-Open No. 2013-175728, what is called a double-gate structure has been known as a structure including a plurality of control electrodes. In general, a semiconductor device of the double-gate structure can improve tradeoff between an on voltage and switching loss.

In the double-gate structure, however, a bidirectional pn junction is formed by providing a gate on both of a first main surface side and a second main surface side. Therefore, a withstand voltage at the time of application of a voltage opposite in polarity to a voltage in normal use across first and second main electrodes (for example, a collector and an emitter of an insulated gate bipolar transistor (IGBT)) cannot be secured, which leads to a concern about destruction of an element in a burn-in test or a screening test for rejecting defective products.

It is also a concern that application of a voltage higher than a voltage of a high-voltage side electrode of the first and second main electrodes to a control electrode is requited for forming a channel on both sides of double gates. Thus, with a wider range of voltages to be applied to the control electrode, a maximum application voltage which represents a maximum value of a voltage difference applied across portions of a semiconductor device is higher than in a normal semiconductor device of a single-gate structure. Consequently, special measures for designing a withstand voltage and designing a gate voltage generation circuit are required and there is a concern about lowering in degree of freedom in design.

The present invention was made to solve such a problem, and an object of the present invention is to provide a semiconductor device of a double-gate structure configured to secure resistance against destruction by a bidirectional voltage between main electrodes, with a range of voltages applied to a control electrode not being expanded.

According to one aspect of the present invention, a semiconductor device include first, third, and fifth semiconductor layers of a first conductivity type, second and fourth semiconductor layers of a second conductivity type, first and second main electrodes, first and second control electrodes, and first and second gate channel regions. The first semiconductor layer includes first and second main surfaces. The second semiconductor layer is disposed on the first main surface of the first semiconductor layer. The third semiconductor layer is selectively disposed in a surface of foe second semiconductor layer. The first main electrode on a side of the first main surface is disposed on the second semiconductor layer and the third semiconductor layer. The first gate channel region is formed between the first semiconductor layer (of the first conductivity type) and the third semiconductor layer (of the first conductivity type) in the second semiconductor layer (of the second conductivity type). The first control electrode is isolated from the first gate channel region by a first gate insulating film. The fourth semiconductor layer is disposed in the second main surface of the first semiconductor layer. The fifth semiconductor layer is selectively disposed in a surface of the fourth semiconductor layer. The second main electrode on a side of the second main surface is disposed on the fourth semiconductor layer and the fifth semiconductor layer. The second gate channel region is of the first conductivity type and provided between the first semiconductor layer (of the first conductivity type) and the fifth semiconductor layer (of the first conductivity type). The second control electrode is isolated from the second gate channel region by a second gate insulating film.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows a chart showing a list of operation modes of an IGBT of a double-gate structure shown in FIG. 1.

FIG. 10 shows a graph of a distribution of an impurity concentration in a region in FIG. 9 which represents at least one of simulation conditions.

FIG. 12 is an operation waveform diagram when the semiconductor device according to the first embodiment is turned on.

FIG. 17 shows a chart showing a list of simulation conditions in FIGS. 18 to 27.

DESCRIPTION OF THE PREFERRED EMBODIMENTS

Figure 1:
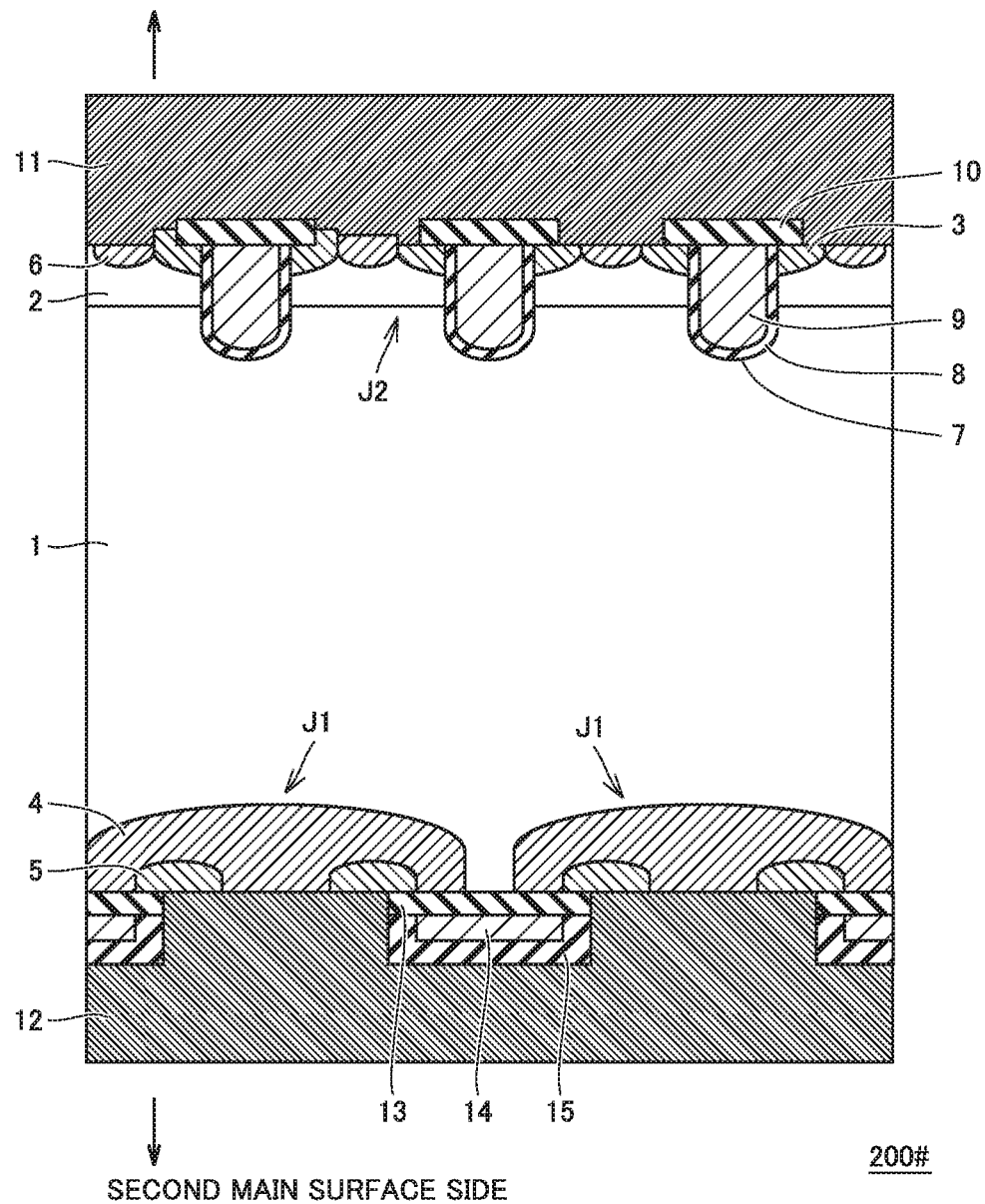
FIG. 1 is a cross-sectional view for illustrating a structure of a semiconductor device according to a comparative example.

An embodiment of the present invention will be described in detail below with reference to the drawings. Though a plurality of embodiments will be described below, combination as appropriate of features described in each embodiment is originally intended. The same or corresponding elements in the drawings have the same reference characters allotted and description thereof will not be repealed in principle.

First Embodiment

Description of Comparative Example

A configuration of a general semiconductor device of a double-gate structure will initially be described as a comparative example of the present embodiment.

FIG. 1 is a cross-sectional view for illustrating a structure of a semiconductor device according to the comparative example.

Referring to FIG. 1, an IGBT of a double-gate structure as a semiconductor device 200# according to the comparative example includes an n base 1 including first and second main surfaces, a p base 2, an n emitter 3, a p collector 4, an n collector 5, a p emitter 6, a trench 7, a first gate insulating film 8, a first gate electrode 9, a first gate interlayer insulating film 10, an emitter electrode 11, a collector electrode 12, a second gate insulating film 13, a second gate electrode 14, and a second gate interlayer insulating film 15.

Emitter electrode 11 is formed of a conductor (representatively a metal) on a surface on a first main surface side of semiconductor device 200#. Similarly, collector electrode 12 is formed of a conductor (representatively a metal) on a surface on a second main surface side of semiconductor device 200#.

P base 2 is disposed on the first main surface side of n base 1. P emitter 6 at a high concentration is selectively provided in a surface of p base 2 (on the first main surface side) for establishing good Ohmic contact with emitter electrode 11. N emitter 3 is selectively disposed in a partial region in p base 2 on the first main surface side.

Trench 7 is provided on the first main surface side of semiconductor device 200# to reach n base 1 through n emitter 3 and p base 2. First gate insulating film 8 is formed on a surface of trench 7. In the inside of trench 7, first gate electrode 9 is formed representatively of polysilicon on first gate insulating film 8 (on the first main surface side). First gate interlayer insulating film 10 is formed between emitter electrode 11, and trench 7 and n emitter 3. A first gate portion of an enhancement n-channel metal oxide semiconductor field effect transistor (MOSFET) structure is thus formed on an emitter side of the first main surface.

P collector 4 is disposed on the second main surface side of n base 1. N collector 5 is selectively disposed in a partial region in p collector 4 on the second main surface side. By forming second gate insulating film 13, second gate electrode 14, and second gate interlayer insulating film 15 in FIG. 1, a second gate portion of an enhancement n-channel MOSFET structure is also formed on a collector side of the second main surface.

Semiconductor device 200# thus includes first and second gate electrodes functioning as control electrodes on respective sides of the first main surface and the second main surface opposed to the first main surface, as a double-gate.

Operations by the IGBT of the double-gate structure will now be described. Operations by the IGBT are controlled by a first gate voltage Vg1 applied to first gate electrode 9 and a second gate voltage Vg2 applied to second gate electrode 14. First gate voltage Vg1 represents a voltage applied to first gate electrode 9 with emitter electrode 11 being defined as the reference and second gate voltage Vg2 represents a voltage applied to second gate electrode 14 with collector electrode 12 being defined as the reference.

FIG. 2 shows a chart showing a list of operation modes of the IGBT of the double-gate structure shown in FIG. 1.

Referring to FIG. 2, operation modes of the IGBT are categorized into eight types in accordance with a combination of a polarity of a collector voltage Vce applied to collector electrode 12 with respect to emitter electrode 11. first gate voltage Vg1, and second gate voltage Vg2.

In FIG. 2, when first gate voltage Vg1 and second gate voltage Vg2 are positive voltages exceeding a threshold voltage Vt, they are denoted by "+" and otherwise (for example, application of a zero voltage or a negative voltage) by "0". Similarly, when a prescribed voltage positive with respect to emitter electrode 11 is applied to collector electrode 12, collector voltage Vce is denoted by and when a prescribed voltage negative with respect to emitter electrode 11 is applied to collector electrode 12, collector voltage Vce is denoted by "−".

In first to fourth operation modes in which a positive voltage (Vce>0) is applied across emitter electrode 11 and collector electrode 12, on and off of the IGBT is controlled by first gate voltage Vg1 on the emitter side.

Specifically, when first gate voltage Vg1="+", that is, a positive voltage exceeding threshold voltage Vt, is applied to first gate electrode 9, a forward current conduction state (which is also simply referred to as an "on state" below) which is a state that a high current flows from collector electrode 12 to emitter electrode 11 even though collector voltage Vce is low is established (second and third operation modes) regardless of whether second gate voltage Vg2 on the collector side is "+" or "0 (no positive voltage exceeding threshold voltage Vt being applied)."

When first gate voltage Vg1 is set to Vg1="0", regardless of whether second gate voltage Vg2 is "+" or "0 (no positive voltage exceeding threshold voltage Vt being applied)," the IGBT is set to a voltage blocking state (which is also simply referred to as an "off state" below) (first and fourth operation modes) in which no current flows from collector electrode 12 to emitter electrode 11 under a condition of Vce>0.

In contrast, in fifth to eighth operation modes in which a negative voltage (Vce<0) is applied across emitter electrode 11 and collector electrode 12, on and off of the IGBT is controlled by second gate voltage Vg2 on the collector side. Specifically, when second gate voltage Vg2 is set to Vg2="+", that is, a positive voltage exceeding threshold voltage Vt, is applied to second gate electrode 14, a reverse current conduction state in which a high current flows from emitter electrode 11 to collector electrode 12 even though a collector voltage |Vce| is low is established (seventh and eighth operation modes) regardless of whether first gate voltage Vg1 on the emitter side is "+" or "0".

When second gate voltage Vg2 is set to Vg2="0", on the other hand, regardless of whether first gate voltage Vg1 is set to "+" or "0", the IGBT is set to the voltage blocking state (the off state) in which no current flows from emitter electrode 11 to collector electrode 12 under a condition of Vce<0 (fifth and sixth operation modes).

In particular, in the second operation mode, while collector voltage Vce (>0) is applied, a positive voltage exceeding threshold voltage Vt is applied to first gate electrode 9 (Vg1="+"), whereas no positive voltage exceeding threshold voltage Vt is applied to second gate electrode 14 (Vg2="0"). Therefore, as a result of inversion of a region in p base 2 in the vicinity of first gate electrode 9 to the n-type, an n-channel (a first n-channel) is formed and a current path from n emitter 3 through the first n-channel to n base 1 is formed. Electrons (negative charges) are injected from emitter electrode 11 through the path into n base 1.

As n base 1 is negatively charged by injected electrons, a pn junction formed by p collector 4 and n base 1 (which is also referred to as a "J1 junction" below) is forward biased. Holes (positive charges) are thus injected from collector electrode 12 through p collector 4 into n base 1.

Consequently, in the second operation mode, a density of holes present in n base 1 increases and conductivity modulation occurs, so that resistive components in n base 1 significantly decrease. The IGBT is thus set to the on state. A voltage drop across the collector and the emitter of the IGBT at this time corresponds to what is called an on voltage.

A turn-off switching operation by the IGBT to make transition from the second operation mode to the voltage blocking slate (off state) under the condition of Vce>0 will now be described.

In the first operation mode, by not applying a positive voltage (Vg1="0") to first gate electrode 9 on the emitter side similarly to second gate voltage Vg2 on the collector side, a region in p base 2 in the vicinity of first gate electrode 9 where the first n-channel has been formed by inversion to the n-type in the second operation mode returns to the p-type. Thus, a path for How of electrons from n emitter 3 to n base 1 disappears so that injection of electrons from emitter electrode 11 into n base 1 is stopped. Thus, forward bias applied to the J1 junction formed by p collector 4 and n base 1 is removed and injection of holes from collector electrode 12 through p collector 4 into n base 1 is stopped.

Consequently, conductivity modulation in n base 1 in the second operation mode is eliminated and a resistance of n base 1 returns to a state before occurrence of conductivity modulation. Furthermore, a pn junction formed by p base 2 and n base 1 (which is also referred to as a "J2 junction" below) is depleted. Thus, the IGBT is set to the voltage blocking state (off state) in which no current flows from collector electrode 12 to emitter electrode 11 under the condition of Vce>0 in the first operation mode.

In particular, in the turn-off switching operation in the second operation mode, by applying a prescribed positive voltage to second gate electrode 14 on the collector side, that is, making transition to the fourth operation mode, immediately before or substantially simultaneously with stop of application of the positive voltage to first gate electrode 9 on the emitter side to thereby invert the region in the vicinity of second gate electrode 14 to the n-type to form a second n-channel, a current path defined by n base 1-the second n-channel-n collector 5 is formed.

As electrons are thus emitted from n base 1 to collector electrode 12, a density of electrons in n base 1 starts to lower. Lowering in density of electrons weakens forward bias applied to the pn junction formed by p collector 4 and n base 1 (the J1 junction) so that injection of holes from p collector 4 into n base 1 is decreased. Under such a condition, by switching a positive voltage applied to first gate electrode 9 to a zero volt or a negative voltage (reverse bias), the first n-channel which has been inverted to the n-type returns to the p-type and injection of electrons from emitter electrode 11 stops. Electrons accumulated in n base 1, on the other hand, escape from the second n-channel through n collector 5 to collector electrode 12. Similarly, holes accumulated in n base 1 escape from p base 2 through p emitter 6 to emitter electrode 11. Furthermore, owing to depletion layer electric field generated by depletion of the pn junction (J2 junction) formed by p base 2 and n base 1, emission of electrons and holes accumulated in n base 1 to collector electrode 12 and emitter electrode 11 described above is accelerated.

Thus, in the turn-off operation, time until excessive charges accumulated in n base 1 disappear is shortened by applying a prescribed positive voltage to second gate electrode 14 on the collector side, that is, by making transition from the second operation mode to the fourth operation mode, immediately before (or substantially simultaneously with) stop of application of the positive voltage to first gate electrode 9 on the emitter side, so that loss in turn-off switching can be reduced.

When an IGBT is applied to a motor control inverter representing an application of an inductance load, in a general IGBT without current conduction capability in a reverse direction, a free wheeling diode (FWD) is generally provided as being externally connected in anti-parallel. By arranging the free wheeling diode, a path for a reverse current produced in a direction reverse to a direction in the on state of the IGBT due to emission of energy accumulated in the inductance load in the off state of the IGBT by a current in the on state of the IGBT can be secured.

In the IGBT of the double-gate structure according to the comparative example, while the IGBT is on under the condition of Vce>0, a forward current conducts (the second operation mode) from collector electrode 12 to the emitter electrode by turn-on of the first gate (Vg1="+"), whereas n base 1 and collector electrode 12 can be rendered conducting by turning on the second gate by applying a positive voltage to second gate electrode 14 (Vg2="+") while the IGBT is off. As n base 1 and collector electrode 12 are rendered conducting, the pn junction (J2 function) formed by p base 2 and n base 1 can function as a diode connected between emitter electrode 11 and collector electrode 12. The IGBT of the double-gate structure can thus secure in the eighth operation mode, a path for a reverse current without externally connecting an FWD.

Similarly, while the IGBT is on under the condition of Vce<0, a reverse current conducts from emitter electrode 11 to collector electrode 12 (the eighth operation mode) by turning on the second gate (Vg2="+"), whereas a path for a reverse current in a direction from emitter electrode 11 to collector electrode 12 can be secured by turning on both of the first gate and the second gate (the third operation mode) while the IGBT is off.

Thus, in the IGBT of the double-gate structure, a function of an embedded FWD can equivalently be performed by controlling a gate voltage. On the other hand, semiconductor device 200# of the general double-gate structure according to the comparative example suffers from problems as below.

Firstly, the problem of securing a withstand voltage in application of a high reverse voltage (Vce<0) across the emitter and the collector arises. Normally, with a state of Vce>0 being assumed as a normal state in semiconductor device 200# in FIG. 1, capability to block a reverse voltage (a withstand voltage in a reverse direction) of the pn junction (J1 junction) formed by p collector 4 and n base 1 is designed to be lower than capability to block a reverse voltage (a withstand voltage in a forward direction) of the pn junction (J2 junction) formed by p base 2 and n base 1.

Therefore, when a high reverse voltage (Vce<0) is inadvertently applied across the emitter and the collector in application of a voltage across the emitter and the collector for the burn-in test or the screening test for rejecting defective products, semiconductor device 200# may be destroyed by damage to the J1 junction caused by application of the reverse voltage exceeding the withstand voltage of the J1 junction. Application of a reverse bias to the J1 junction may be avoided by controlling second gate voltage Vg2 as described with reference to FIG. 2. In this case, however, there is a concern about complication of a test apparatus and increase in test load.

Secondly, in connection with the IGBT of the double-gate structure, there is a concern about necessity of a design for increasing a withstand voltage (voltage blocking capability) due to increase in maximum application voltage which is a voltage difference applied to a device. For example, a maximum application voltage of a connection where the emitter electrode of the IGBT is grounded and a power supply voltage (for example, DC 15 (V)) is applied to the collector electrode as a collector voltage is considered.

In a normal IGBT of the single-gate structure, during an on operation, a voltage that is positive (for example, 15 (V)) with respect to the emitter electrode and comparable to a collector voltage is applied to the gate electrode. During an off operation, on the other hand, 0 (V) or a negative voltage approximately half in magnitude the positive voltage (for example, −5 to 6 (V)) is applied to the gate electrode. Therefore, in the IGBT of the single-gate structure, the maximum application voltage is comparable to the collector voltage (for example, 15 (V)) or a voltage corresponding to the sum of the collector voltage and an absolute value of the negative voltage (for example, from 21 to 22 (V)).

In the IGBT of the double-gate structure, on the other hand, during the off operation, 0 (V) is applied to first gate electrode 9 and second gate electrode 14. During the on operation, a positive voltage (for example, 15 (V)) comparable to the collector voltage is applied to first gate electrode 9, whereas 0 (V) is applied to second gate electrode 14. Therefore, during the on operation and the off operation, the maximum application voltage is comparable to the collector voltage (for example, 15 (V)).

When the IGBT of the double-gate structure is turned off (the fourth operation mode in FIG. 2), however, 0 (V) or the negative voltage (for example, −5 to 6 (V)) is applied to first gate electrode 9, and a positive voltage higher than the collector voltage resulting from superimposition of a prescribed voltage positive with respect to collector electrode 12 (for example, 15 (V)) is applied to second gate electrode 14. Therefore, the maximum application voltage to the IGBT of the double-gate structure is set to a positive voltage higher than the collector voltage (for example, 15+15=30 (V)) or a voltage resulting from further superimposition of the absolute value of the negative voltage on the positive voltage (for example, 15+15+to 6=35 to 36 (V)).

Thus, since the IGBT of the double-gate structure is higher in maximum application voltage than the normal IGBT of the single-gate structure, a design for enhancing voltage blocking capability (withstand voltage) in a gate structure portion is required and hence a degree of freedom in design is disadvantageously lowered.

Furthermore, in the IGBT of the double-gate structure, an effective region (a p collector region) functioning as the IGBT is made smaller by providing second gate electrode 14 for achieving a more sophisticated function. Therefore, there is a concern about increase in on voltage as compared with a voltage in a general IGBT.

In the IGBT of the double-gate structure, switching loss at the time of turn-on and turn-off is low, that is, a switching time period is short, which means that a rate of change over time in current (dI/dt) and a rate of change over time in voltage (dV/dt) at the time of switching operation are high. Therefore, there is a concern about increase in surge voltage (L×dI/dt) dependent on a product between an inductance (L) of a current path and the rate of change over time (dI/dt) in current. Increase in surge voltage affects a design of a voltage of a device or a design of a withstand voltage of an apparatus, and may be a factor for increase in cost for addition of a snubber circuit for suppressing an overvoltage.

Double-Gate Structure According to First Embodiment

A configuration of an IGBT of a double-gate structure according to a first embodiment will now be described.

Figure 3:
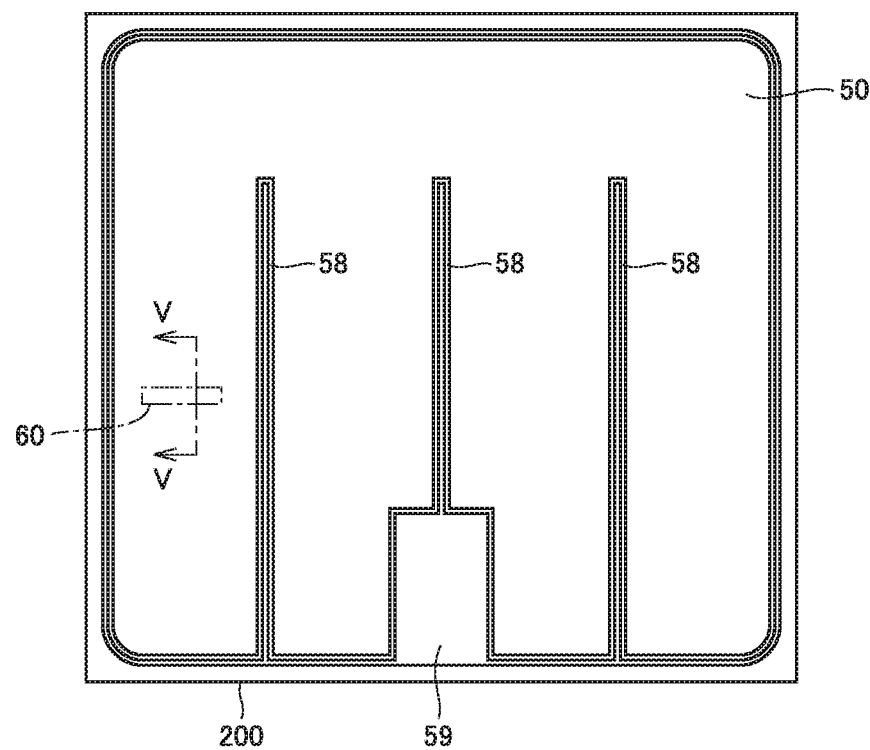
FIG. 3 is a plan view of an emitter electrode surface of a semiconductor device according to a first embodiment.
Figure 4:
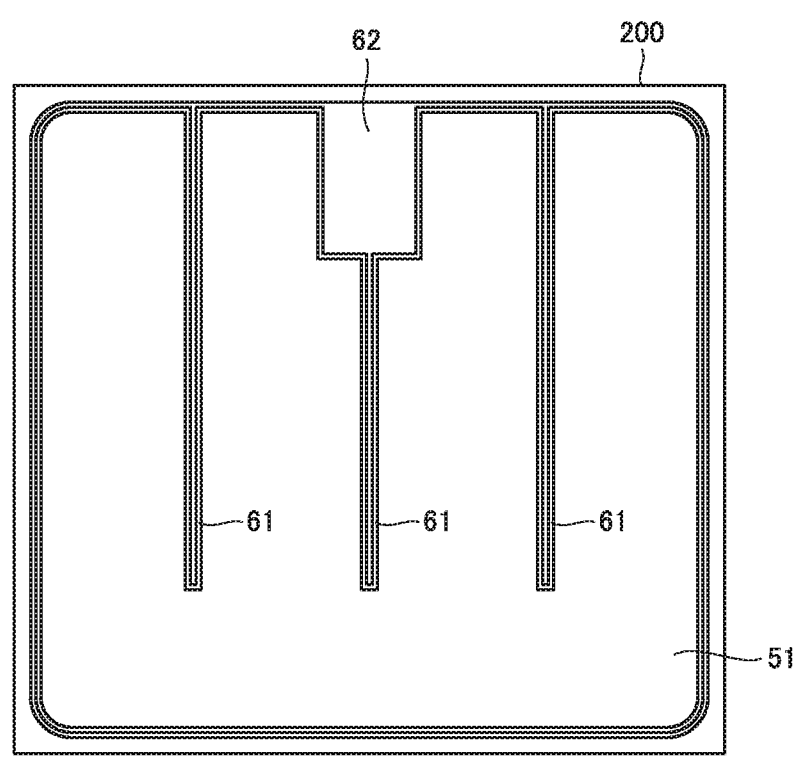
FIG. 4 is a plan view of a collector electrode surface in the semiconductor device according to the first embodiment.
Figure 5:
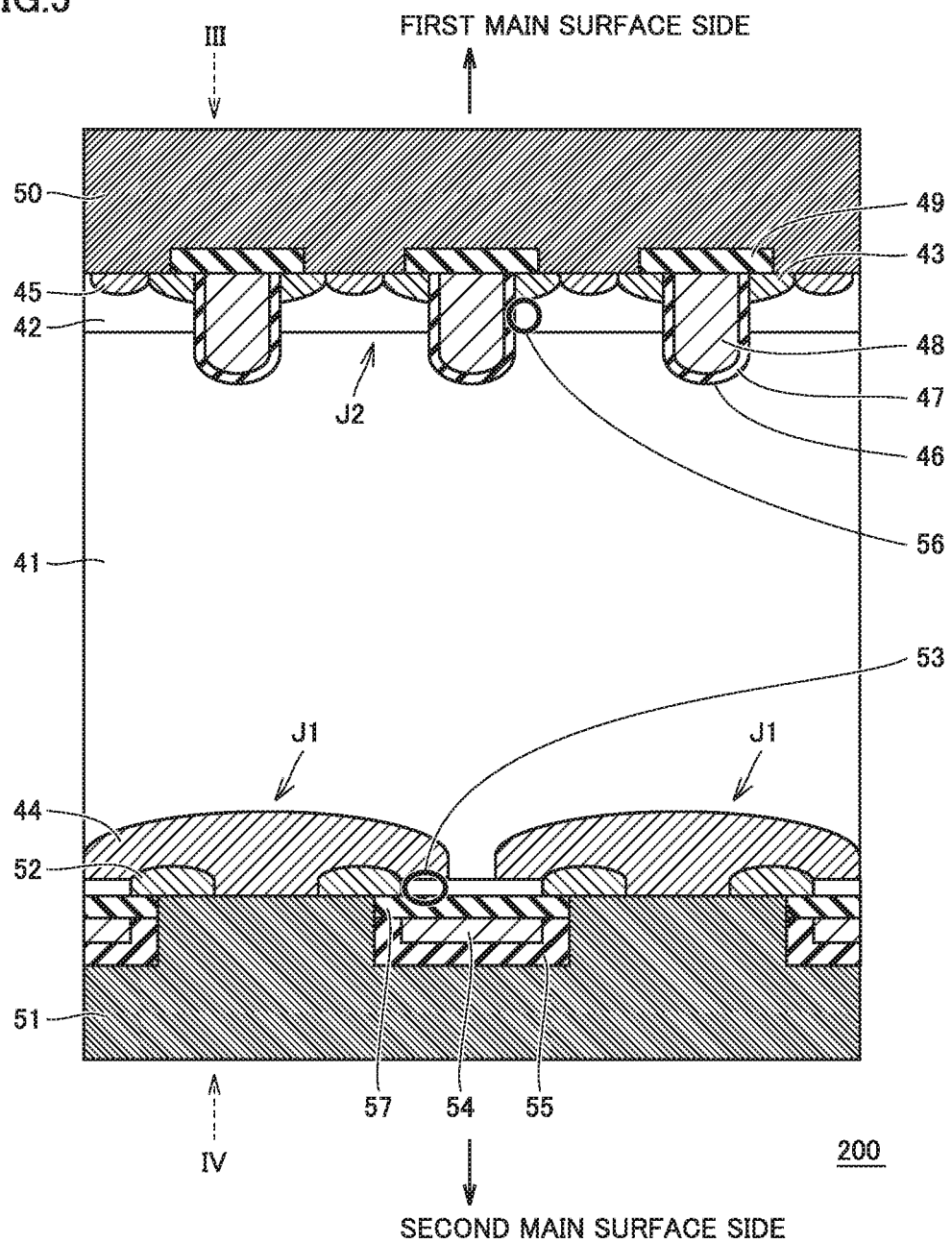
FIG. 5 is a partial cross-sectional view of the semiconductor device according to the first embodiment.

FIG. 3 is a plan view of an emitter electrode surface of a semiconductor device according to the first embodiment. FIG. 4 is a plan view of a collector electrode surface in the semiconductor device according to the first embodiment. The collector electrode surface is opposed to the emitter electrode surface shown in FIG. 2. FIG. 5 is a partial cross-sectional view of the semiconductor device according to the first embodiment and more specifically shows a cross-sectional view along V-V in FIG. 3.

Referring to FIG. 3, a semiconductor device 200 according to the first embodiment is an IGBT of the double-gate structure, and includes an emitter electrode 50 on a first main surface side. On the first main surface side of semiconductor device 200, a gate interconnection 58 and a gate pad 59 electrically connected to a first gate electrode which will be described later are further arranged. First gate voltage Vg1 applied to the first gate electrode is input to gate pad 59 from the outside of semiconductor device 200 and transmitted to the first gate electrode through gate interconnection 58. A part of an IGBT cell is labeled with a reference character 60.

Referring to FIG. 4, semiconductor device 200 according to the first embodiment includes a collector electrode 51 on the second main surface side. On the second main surface side of semiconductor device 200, a gate interconnection 61 and a gate pad 62 electrically connected to a second gate electrode which will be described are further arranged. Second gate voltage Vg2 applied to the second gate electrode is input to gate pad 62 from the outside of semiconductor device 200 and transmitted to the second gate electrode through gate interconnection 61.

FIG. 5 shows a cross-sectional view (V-V cross-sectional view) of a portion shown with reference character 60 shown in FIG. 3.

Referring to FIG. 5, semiconductor device 200 according to the first embodiment includes an n base 41 including first and second main surfaces, a p base 42, an n emitter 43, a p collector 44, a p emitter 45, a trench 46, a first gate insulating film 47, a first gate electrode 48, a first gate interlayer insulating film 49, emitter electrode 50. collector electrode 51, an n collector 52, a second gate electrode 54, a second gate interlayer insulating film 55, and a second gate insulating film 57.

N base 41 corresponds to one example of the "first semiconductor layer" and the n-type corresponds to the "first conductivity type" in the present embodiment. P base 42 is disposed on the first main surface of n base 41 and corresponds to one example of the "second semiconductor layer." In the present embodiment, the p-type corresponds to the "second conductivity type." N emitter 43 is selectively disposed in a surface of p base 42 and corresponds to one example of the "third semiconductor layer." P emitter 45 at a high concentration is selectively provided in the surface of p base 42 (on the first main surface side) for establishing good Ohmic contact with emitter electrode 50.

Emitter electrode 50 is disposed on an upper surface (on the first main surface side) of p base 42 and n emitter 43 and arranged on the first main surface of semiconductor device 200. Emitter electrode 50 corresponds to one example of the "first main electrode."

Trench 46 is provided to reach n base 41 from a surface of n emitter 43 through p base 42. First gate insulating film 47 is formed on a surface of trench 46. In the inside of trench 46, first gate electrode 48 is formed on first gate insulating film 47 (on the first main surface side). Trench 46 corresponds to one example of the "first trench" and first gate insulating film 47 corresponds to one example of the "first gate insulating film."

A first gate channel region 56 is formed in a region in p base 42 between n base 41 and n emitter 43. First gate channel region 56 is different in conductivity type (p-type) from n base 41 and n emitter 43 adjacent thereto. In first gate channel region 56, a channel is formed or disappears in accordance with first gate voltage Vg1 applied to first gate electrode 48 with emitter electrode 50 being defined as the reference. Specifically, when first gate voltage Vg1 exceeds threshold voltage Vt, that is, when a voltage higher than threshold voltage Vt (which is also simply referred to as a "control voltage" below) that is positive with respect to a voltage of emitter electrode 50 is applied to first gate electrode 48, a channel is formed in first gate channel region 56. When no positive voltage, is applied to first gate electrode 48, no channel is formed in first gate channel region 56.

Therefore, a first gate portion on the emitter side has an enhancement n-channel MOSFET structure, and normally-off first gate channel region 56 is formed by a voltage of first gate electrode 48 (first gate voltage Vg1). First gate electrode 48 corresponds to one example of the "first control electrode" which controls a normally-off channel region. A pn junction formed by p base 42 and n base 41 is also referred to as a "J2 junction" below.

P collector 44 is disposed in the second main surface of n base 41. P collector 44 corresponds to one example of the "fourth semiconductor layer." N collector 52 at a high concentration is selectively disposed in a surface of p collector 44 (on the second main surface side) for establishing good Ohmic contact with collector electrode 51 and corresponds to one example of the "fifth semiconductor layer." Collector electrode 51 is disposed on p collector 44 and n collector 52 (on the second main surface side) and arranged on the second main surface of semiconductor device 200. Collector electrode 51 corresponds to one example of the "second main electrode." A second gate channel region 53 is provided in proximity to second gate electrode 54 between n base 41 and n collector 52. Second gate channel region 53 is formed to have the n-type to be identical in conductivity type to n base 41 and n collector 52 adjacent thereto. Second gate insulating film 57 corresponds to one example of the "second gate insulating film" formed between second gate electrode 54 and second gate channel region 53.

When a negative voltage having an absolute value equal to or higher than a certain value with respect to a voltage of collector electrode 51 (which is also simply referred to as a "negative voltage" below) is applied to second gate electrode 54, no channel is formed in n-type second gate channel region 53. When no negative voltage is applied to second gate electrode 54, a channel is formed in n-type second gate channel region 53.

Thus, a second gate portion on the collector side has a depression n-channel MOSFET structure, and normally-on second gate channel region 53 is formed by a voltage of second gate electrode 54 (second gate voltage Vg2). Second gate electrode 54 corresponds to one example of the "second control electrode" which controls a normally-on channel region. A pn junction formed by p collector 44 and n base 41 is also referred to as a "J1 junction" below.

First gate insulating film 47 and second gate insulating film 57 are normally formed from an oxide film (representatively $SiO_2$) First gate electrode 48 and second gate electrode 54 are representatively composed of polysilicon doped with an n-type impurity.

First gate interlayer insulating film 49 and second gate interlayer insulating film 55 are composed, for example, of silicate glass containing boron and phosphorus (which is also referred to as BPSG below). Emitter electrode 50, collector electrode 51, gate interconnections 58 and 61, and gate pads 59 and 62 can be formed, for example, of aluminum (Al) containing silicon (Si).

A polysilicon portion in a path from first gate electrode 48 to gate pad 59 and a path from second gate electrode 54 to gate pad 62 can be made smaller by gate interconnection 58 electrically connected to first gate electrode 48 and gate interconnection 61 electrically connected to second gate electrode 54. Since an electrical resistance between first gate electrode 48 and gate pad 59 and between second gate electrode 54 and gate pad 62 can thus be lowered, a control operation in semiconductor device 200 can be uniform.

Thus, according to semiconductor device 200 of the double-gate structure according to the first embodiment, similarly to the conventional double-gate structure, on and off can be controlled by a voltage signal applied to first gate electrode 48 and second gate electrode 54 of the MOSFET structure. In particular, lower electric power and a higher speed in driving can be achieved by providing a depression MOS structure also for a second gate controlled to be normally on. Furthermore, semiconductor device 200 according to the first embodiment achieves advantages as will be described below.

Initially, the second gate has a normally-on structure. Therefore, even though a reverse voltage (Vce<0) is applied across emitter electrode 50 and collector electrode 51 while no voltage signal is applied to second gate electrode 54 (Vg2=0), a current can flow in a reverse direction through a path from emitter electrode 50 through p emitter 45, p base 42, n base 41, second gate channel region 53, and n collector 52 to collector electrode 51. Therefore, even though a high reverse voltage (Vce<0) is inadvertently applied across the emitter and the collector in the burn-in test or the screening test, substantially no reverse voltage is applied to the J1 junction formed by p collector 44 and n base 41. Therefore, a problem of destruction by application of a reverse voltage as in semiconductor device 200# (of the general double-gate structure) according to the comparative example described above can be solved. Namely, resistance against destruction by a bidirectional voltage between collector electrode 51 and emitter electrode 50 can be secured.

In connection with the semiconductor device according to the first embodiment, a connection where the emitter electrode is grounded and a power supply voltage (for example, DC 15 (V)) is applied to the collector electrode as a collector voltage is assumed as in the comparative example. Then, a voltage applied to normally-off first gate electrode 48 is similar to a voltage in the normal double-gate structure described with reference to FIG. 1. On the other hand, a voltage applied to second gate electrode 54 is different from a voltage in the normal double-gate structure. Specifically, a voltage negative with respect to collector electrode 51 is applied to second gate electrode 54 in the off state, and the negative voltage is removed or a zero voltage (a voltage comparable to a voltage of collector electrode 51) is applied in the on state. Consequently, unlike the normal double-gate structure described with reference to FIG. 1, a voltage higher than a collector voltage is not applied to second gate electrode 54 throughout on and off periods. Therefore, in the semiconductor device of the double-gate structure according to the first embodiment, a range of a gate voltage is comparable to a range in the single-gate structure and is not as wide as in the normal double-gate structure. Consequently, the maximum application voltage is not as high as in the normal double-gate structure either but is comparable to the voltage in the single-gate structure. Therefore, since capability to block a voltage (withstand voltage) in the gate structure portion can be designed in common to that of the normal single-gate structure, a degree of freedom in design is not lowered. Since a design of a withstand voltage of a drive control circuit for supplying first gate voltage Vg1 and second gate voltage Vg2 can also be in common to that of the IGBT of the single-gate structure, the design is facilitated.

Result of Simulation

A result of simulation of semiconductor device 200 according to the first embodiment shown in FIG. 5 will now be described. Initially, FIG. 6 shows a symbol diagram of the semiconductor device according to the present embodiment.

Figure 6:
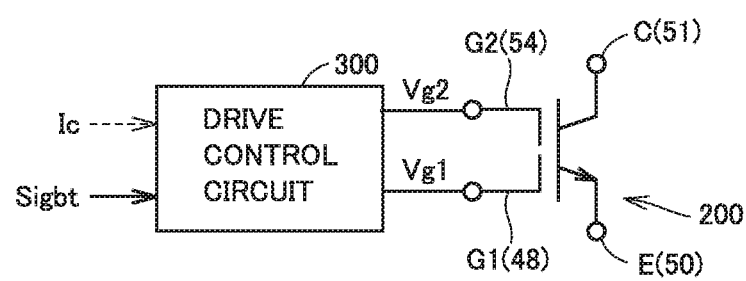
FIG. 6 is a symbol diagram of the semiconductor device according to the present embodiment.

Referring to FIG. 6, semiconductor device 200 according to the first embodiment includes a first gate G1 corresponding to first gate electrode 48, a second gate G2 corresponding to second gate electrode 54, an emitter E corresponding to emitter electrode 50, and a collector C corresponding to collector electrode 51.

As described above, collector voltage Vce is defined as a voltage of collector C with respect to emitter E, first gate voltage Vg1 is defined as a voltage of first gate G1 with respect to emitter E, and second gate voltage Vg2 is defined as a voltage of second gate G2 with respect to collector C.

A drive control circuit 300 generates first gate voltage Vg1 and second gate voltage Vg2 to have semiconductor device 200 perform an on operation or an off operation in response to an on-off command signal Sight. First gate voltage Vg1 and second gate voltage Vg2 are input to gate pads 59 and 62 shown in FIGS. 3 and 4, respectively. Drive control circuit 300 can be configured as a known analog or digital circuit. In particular, in recent years, a gate voltage can finely be controlled by adopting a digital scheme.

An intelligent power module (IPM) can also be implemented by an integrated structure of drive control circuit 300 and semiconductor device 200. A detected value of a collector current Ic of semiconductor device 200 may be input to drive control circuit 300 for protection against an overcurrent. Collector current Ic can be detected by a current detection resistor or a Rogowski coil connected between emitter electrode 50 and collector electrode 51.

The semiconductor device according to the present invention may be implemented by a single semiconductor device 200 (IGBT) alone or a combination of semiconductor device 200 (IGBT) and drive control circuit 300. In the latter case, semiconductor device 200 (IGBT) and drive control circuit 300 may be integrated with each other or separate from each other.

As described above, in the present embodiment, semiconductor device 200 is basically turned on and off with emitter E being grounded and with collector C being supplied with a power supply voltage (Vce>0). Collector current Ic represents a current produced between collector C and emitter E with a direction of flow from collector C to emitter E being defined as a positive direction.

Figure 7:
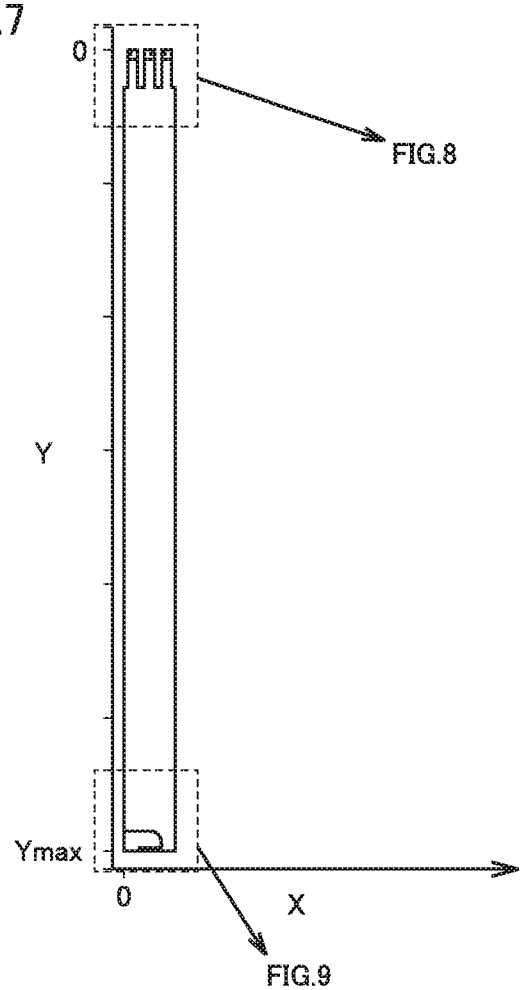
FIG. 7 is a cross-sectional view of a cell model of an IGBT of a double-gate structure to be simulated.

FIG. 7 shows a cross-sectional view of a cell model of an IGBT of the double-gate structure to be simulated.

Referring to FIG. 7, Y=0 on a Y axis corresponds to a surface of contact with emitter electrode 50 on the first main surface of semiconductor device 200, and Y=Ymax corresponds to a surface of contact with collector electrode 51 on the second main surface of semiconductor device 200. In the present simulation, a condition of Ymax=120 (μm) is set and voltage blocking capability of semiconductor device 200 of 1200 (V) class is assumed.

Figure 8:
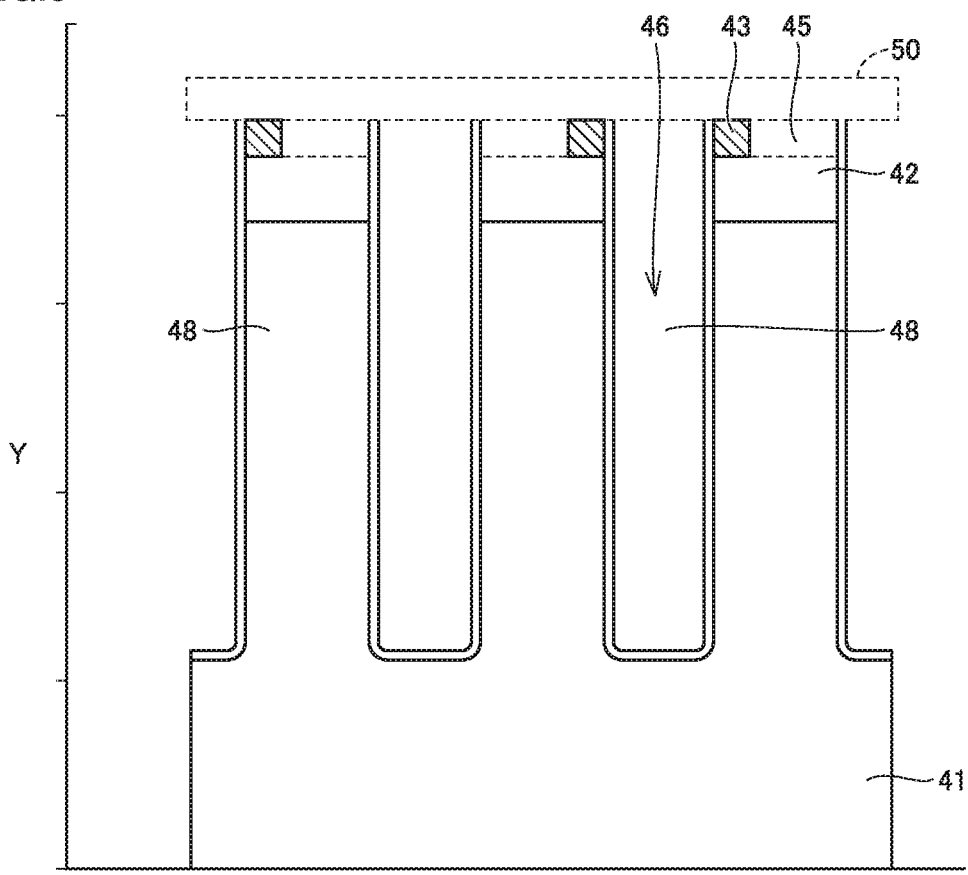
FIG. 8 is an enlarged view of a first main surface side in FIG. 7.
Figure 9:
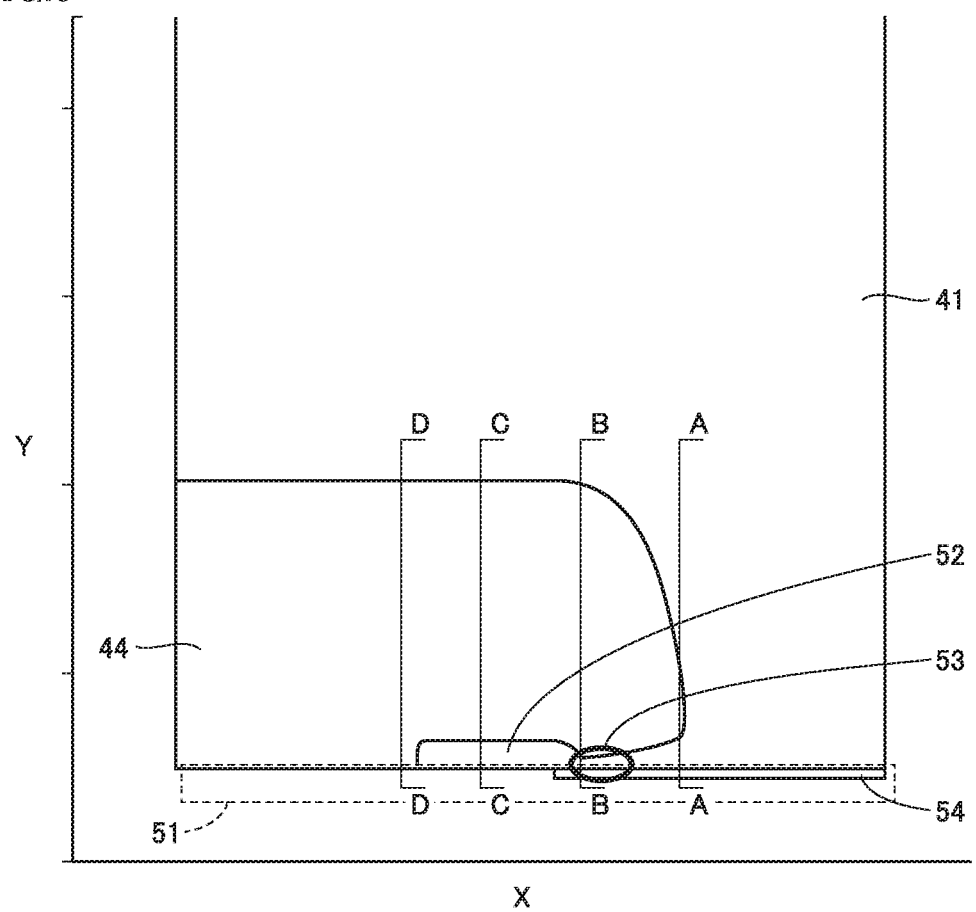
FIG. 9 is an enlarged view of a second main surface side in FIG. 7.

The cross-sectional structure of the cell model shown in FIG. 7 is similar to the structure in the cross-sectional view in FIG. 5, and FIG. 8 shows an enlarged view of a region surrounded by a dotted line on the first main surface side in FIG. 7. FIG. 9 shows an enlarged view of a region surrounded by a dotted line on the second main surface side in FIG. 7.

Referring to FIG. 8, as described with reference to FIG. 5, n emitter 43 is selectively disposed in the upper surface (on the first main surface side) of p base 42 formed on the first main surface of n base 41. First gate channel region 56 is formed between n emitter 43 and n base 41. As described above, a channel is formed in normally-off first gate channel region 56 when a voltage positive with respect to emitter electrode 50 is applied to first gate electrode 48 disposed in trench 46.

Referring to FIG. 9, n collector 52 is selectively disposed in the surface (on the second main surface side) of p collector 44 disposed in the second main surface of n base 41. P collector 44 and n collector 52 are in contact with collector electrode 51. Second gate channel region 53 in proximity to second gate electrode 54 is provided in a portion of connection between n base 41 and n collector 52. As described above, a channel is not formed between n base 41 and n collector 52 in normally-on second gate channel region 53 when a voltage negative with respect to collector electrode 51 is applied to second gate electrode 54.

FIG. 10 shows a graph of a distribution of an impurity density in a region in FIG. 9 which represents at least one of simulation conditions. FIG. 10 shows lines P1 to P4 showing distributions of impurity densities along the Y axis in portions shown with A-A, B-B, C-C, and D-D in FIG. 9, respectively.

Referring to FIG. 10, a dimension of depth of p collector 44 from the surface of the second main surface (Y=Ymax) is approximately 3 (μm), a dimension of depth of n collector 52 from the surface of the second main surface is approximately 0.4 (μm), and a dimension of depth of second gate channel region 53 from the surface of the second main surface is approximately 0.1 (μm). An impurity density in second gate channel region 53 is approximately $3 \times 10^{17}$ (atoms/cm$^3$).

In the structure above, when second gate voltage Vg2 across collector electrode 51 and second gate electrode 54 is set approximately to −4 (V) to −5 (V), normally-on second gate channel region 53 starts to exhibit current cut-off characteristics, and when an absolute value of the negative voltage is further increased, n collector 52 and n base 41 are electrically disconnected from each other.

FIGS. 11A to 11D show results of simulation of current and voltage characteristics (what is called an I-V curve) of the semiconductor device according to the first embodiment by using the cell models of the IGBT of the double-gate structure described with reference to FIGS. 7 to 10.

Each of FIGS. 11A to 11D shows an I-V curve at an element temperature T=25 (° C.) and an element temperature of 150 (° C.) for each combination of first gate voltage Vg1 and second gate voltage Vg2. The abscissa of each I-V curve represents a collector voltage Vce (V) and the ordinate represents a collector current density Jce (A/cm$^2$). The condition of T=25 (° C.) assumes a room temperature and the condition of T=150 (° C.) assumes a high temperature due to generation of heat from the element.

Figure 11A:
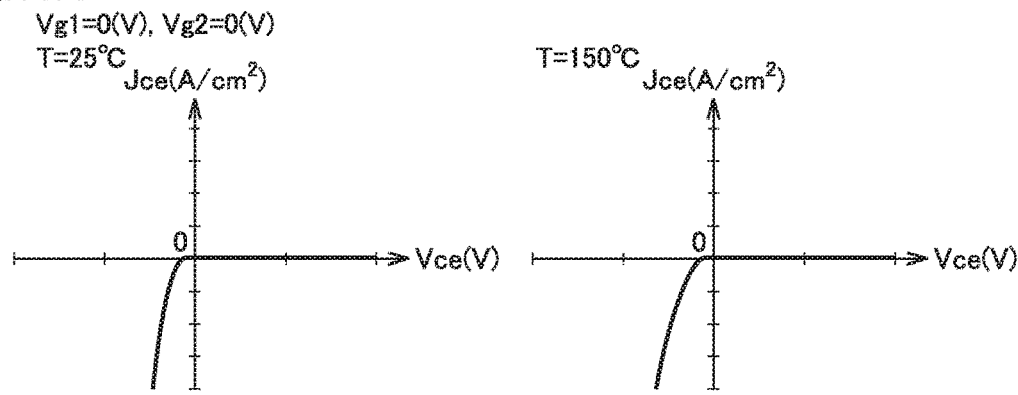
FIGS. 11A to 11D show first to fourth graphs of results of simulation of current and voltage characteristics of the semiconductor device according to the first embodiment by using the cell models shown in FIGS. 7 to 10.

FIG. 11A shows I-V characteristics when a condition of Vg1=Vg2=0 (V) is satisfied, that is, when the normally-off first gate is off and the normally-on second gate is on. In this case, semiconductor device 200 is in a voltage blocking state (Ic=0) in a region where the condition of Vce>0 is satisfied. In the region where the condition of Vce<0 is satisfied, on the other hand, a reverse current (Ice<0) is generated in a direction from emitter electrode 50 to collector electrode 51.

Figure 11B:
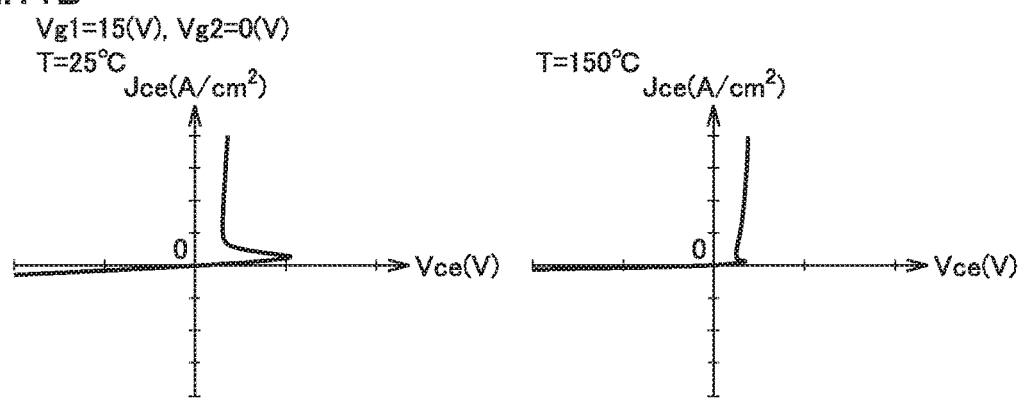

FIG. 11B shows I-V characteristics when a condition of Vg1=15 (V) and Vg2=0 (V) is satisfied, that is, when both of the normally-off first gate and the normally-on second gate are on.

Referring again to FIG. 5, a channel is formed in first gate channel region 56 by applying a predetermined positive voltage (15 (V)) across emitter electrode 50 and first gate electrode 48. The normally-off first gate is turned on. Electrons are thus injected into n base 41 from emitter electrode 50 through n emitter 43 and first gate channel region 56. As the injected electrons lower a potential of n base 41, the J1 junction formed by p collector 44 and n base 41 is forward biased and hence holes are injected from collector electrode 51 through p collector 44 into n base 41.

Consequently, an electrical resistance of n base 41 is significantly lowered owing to a conductivity modulation effect obtained by increase in density of electrons and density of holes in n base 41. In the region where the condition of Vce>0 is satisfied, semiconductor device 200 is thus in the on state in which a high collector current flows from collector electrode 51 to emitter electrode 50 even though collector voltage Vcc is low. In the region where the condition of Vce<0 is satisfied, on the other hand, substantially no collector current flows but a low reverse current flows through the first n-channel and the second n-channel in a direction from emitter electrode 50 to collector electrode 51.

Though collector voltage Vcc at the time when the collector current flows is ideally zero, the collector voltage is actually a positive voltage comparable to what is called an on voltage owing to a voltage drop in the IGBT (mainly n base 41).

Figure 11C:
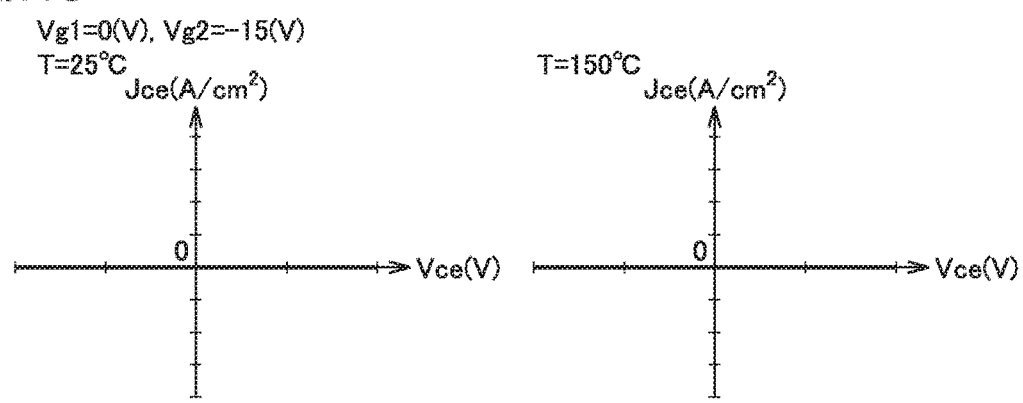

FIG. 11C shows I-V characteristics when a condition of Vg1=0 (V) and Vg2=−15 (V) is satisfied, that is, when both of the normally-off first gate and the normally-on second gate are off. In this case, semiconductor device 200 is completely in the voltage blocking state (Ic=0) throughout the region where the condition of Vce>0 is satisfied and the region where the condition of Vce<0 is satisfied.

Figure 11D:
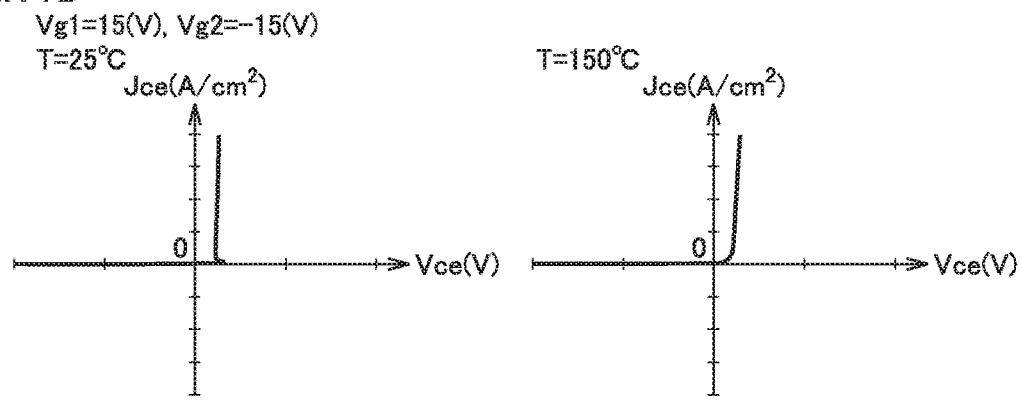

FIG. 11D shows I-V characteristics when a condition of Vg1=15 (V) and Vg2=−15 (V) is satisfied, that is, when the normally-off first gate is on whereas the normally-on second gate is off.

Referring again to FIG. 5, when a prescribed negative voltage (−15 (V)) is applied across collector electrode 51 and second gate electrode 54, n collector 52 and n base 41 are electrically disconnected from each other by an n region becoming a high resistance region due to depletion thereof in second gate channel region 53 which renders n collector 52 and n base 41 conducting to each other or by reverse bias characteristics of a pn junction formed by inversion to the p-type. Namely, the normally-on second gate is turned off.

As a result of such disconnection, the J1 junction formed by p collector 44 and n base 41 can be forward biased with low Vce. Then, injection of holes from p collector 44 into n base 41 increases so that a density of holes in n base 41 increases. By applying a prescribed negative voltage (−15 (V)) across collector electrode 51 and second gate electrode 54, a positive potential in a portion in p collector 44 in the vicinity of collector electrode 51 becomes higher. Efficiency in injection of holes into n base 41 is further enhanced so that an electrical resistance of n base 41 is further lowered.

Referring again to FIG. 11D, in FIG. 11D as in FIG. 11B, as a result of turn-on of the first gate, in the region where the condition of Vce>0 is satisfied, an on state in which a high collector current flows from collector electrode 51 to emitter electrode 50 is established even though collector voltage Vce is low. With an effect of further lowering in electrical resistance of n base 41 as described above by turning off the second gate by setting Vg2 to Vg2=−15 (V), however, an on voltage can be lower than in FIG. 11B. It is further understood that a reverse current can be suppressed as compared with FIG. 11B also in the region where the condition of Vce<0 is satisfied.

As is understood from comparison between FIGS. 11B and 11D, when no negative voltage is applied to second gate electrode 54 as in FIG. 11B in having semiconductor device 200 perform an on operation by applying a positive voltage (15 (V)) to first gate electrode 48, the semiconductor device performs a MOSFET operation when a current is low. When collector voltage Vce increases, however, the semiconductor device makes transition to perform an IGBT operation. Then, a phenomenon ( what is called a snapback phenomenon) in which collector voltage Vce is temporarily significantly lowered may occur. In the result of simulation in FIG. 11B as well, the snapback phenomenon noticeably occurs at a room temperature (T=25 (° C.). It is understood, on the other hand, that the snapback phenomenon can be suppressed by applying a negative voltage (Vg2=−15 (V)) to second gate electrode 54 in having semiconductor device 200 perform the on operation as shown in FIG. 11D.

Basic Switching Control

Basic turn-on and turn-off control, that is, switching control, of semiconductor device 200 according to the first embodiment will now be described.

Figure 12:
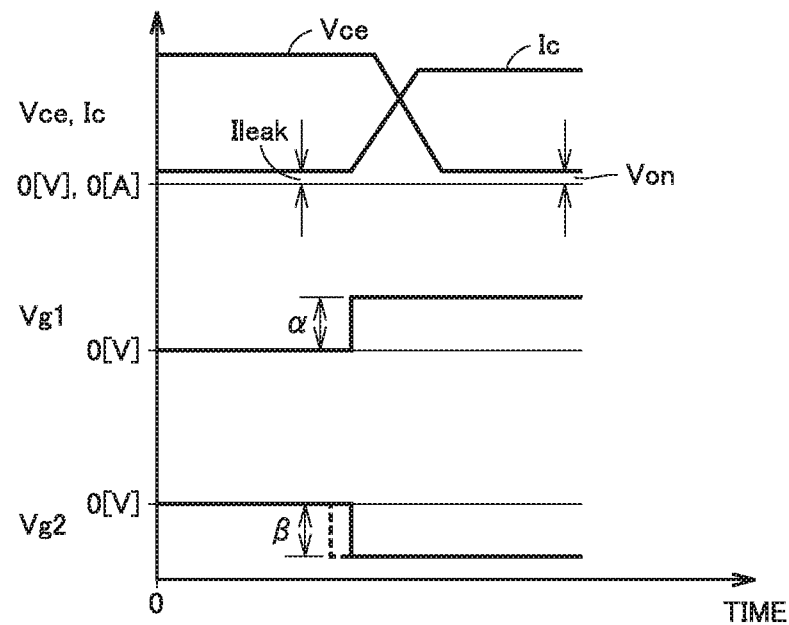

FIG. 12 shows an operation waveform diagram when semiconductor device 200 is turned on. The turn-on operation corresponds to the "first switching operation."

Referring to FIG. 12, under the condition of Vce>0, by setting the condition of Vg1=Vg2=0 as shown in FIG. 11A, semiconductor device 200 is turned off. During the off state, collector voltage Vce is comparable to a power supply voltage connected to collector C in FIG. 6, and collector current Ic is ideally zero. Actually, however, a low leak current flows (Ic=Ileak).

As described with reference to FIGS. 11C and 11D, a voltage (Vg1=α (V)) positive with respect to emitter electrode 50 can be applied to first gate electrode 48. As described with reference to FIG. 11D, the snapback phenomenon can be suppressed by applying a voltage (Vg2=−β (V)) negative with respect to collector electrode 51 to second gate electrode 54.

It is feared that the snapback phenomenon described above may lead to a non-uniform current in particular when a plurality of IGBTs are used as being connected in parallel. Therefore, as shown in FIG 12, a negative voltage is applied to second gate electrode 54, that is, second gate voltage Vg2 is varied from 0 (V) to −β (V), simultaneously with or before the timing of application of a positive voltage to first gate electrode 48, that is, the timing of variation in first gate voltage Vg1 from 0 (V) to α (V).

By thus generating second gate voltage Vg2 for not forming a channel in second gate channel region 53 simultaneously with or immediately before generation of first gate voltage Vg1 for forming a channel in first gate channel region 56, stability of operations by semiconductor device 200 at the time of turn-on can be enhanced.

Figure 13:
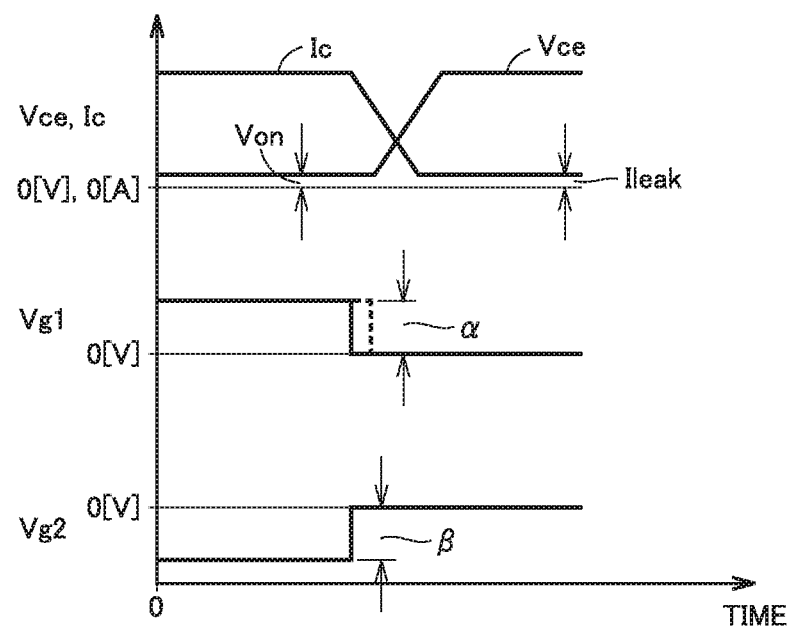
FIG. 13 is an operation waveform diagram when the semiconductor device according to the first embodiment is turned off.

FIG. 13 shows an operation waveform diagram when semiconductor device 200 is turned off. The turn-off operation corresponds to the "second switching operation."

Referring to FIG. 13, under the condition of Vce>0, semiconductor device 200 can be turned off by setting the condition of Vg1=Vg2=0 as shown in FIG. 11A. At the time of turn-off, by stopping application of a positive voltage to first gate electrode 48 in order to turn off the normally-off first gate, first gate voltage Vg1 is varied from α (V) to 0 (V).

Referring again to FIG. 5, when the condition of first gate voltage Vg1=0 (V) is satisfied, first gate channel region 56 in p base 42 of which conductivity type has been inverted to the n-type during application of a positive voltage returns to the p-type, so that injection of electrons from emitter electrode 50 into n base 41 is stopped. Injection of holes from p collector 44 into n base 41 is thus also stopped. Thereafter, excessive holes accumulated in n base 41 are reduced by recombination with electrons or emission out of emitter electrode 50 from p emitter 45 through p base 42.

When the normally-on second gate is turned on concurrently with such turn-off of the first gate, second gate channel region 53 is depleted or returns to the n-type from the state of inversion to the p-type, so that second gate channel region 53 restores an electrical conduction function as an n-type semiconductor. N collector 52 and n base 41 are thus rendered conducting, and injection of holes from the J1 junction formed by p collector 44 and n base 41 into n base 41 can be suppressed. Since electrons accumulated in n base 41 are promptly emitted to collector electrode 51 through second gate channel region 53 and n collector 52, disappearance of excessive electrons accumulated in n base 41 is also accelerated.

Therefore, in n base 41, a switching time period required for turn-off can be shortened by prompt emission of excessive electrons through second gate channel region 53 at a rate higher than in recombination (combination between excessive elections and excessive holes) dependent on lifetime of minority carriers. Consequently, switching loss at the time of turn-off can also be suppressed.

With prompt emission of excessive charges accumulated in n base 41, the voltage blocking function (reverse bias blocking) by the J2 junction formed by n base 41 and p base 42 is also promptly restored. As a result of prompt depletion of the vicinity of the J2 junction, a time period for lowering collector current Ic (that is, increase in dI/dt) and a time period for increasing collector voltage Vce (increase in dV/dt) are also shortened. Therefore, time required for turn-off can be shortened also in this aspect.

Referring again to FIG. 13, when semiconductor device 200 is turned off, the normally-on second gate is turned on by varying a negative voltage ($-\beta$ (V)) applied across collector electrode 51 and second gate electrode 54 to 0 (V) simultaneously with or before turn-off of the first gate at which first gate voltage Vg1 is varied from $\alpha$ (V) to 0 (V).

By thus stopping generation of second gate voltage Vg2 for not forming a channel in second gate channel region 53 simultaneously with or immediately before stop of generation of first gate voltage Vg1 for forming a channel in first gate channel region 56 to thereby shorten a switching ti me period required for turn-off described above, switching loss at the time of turn-off can be suppressed.

Figure 14:
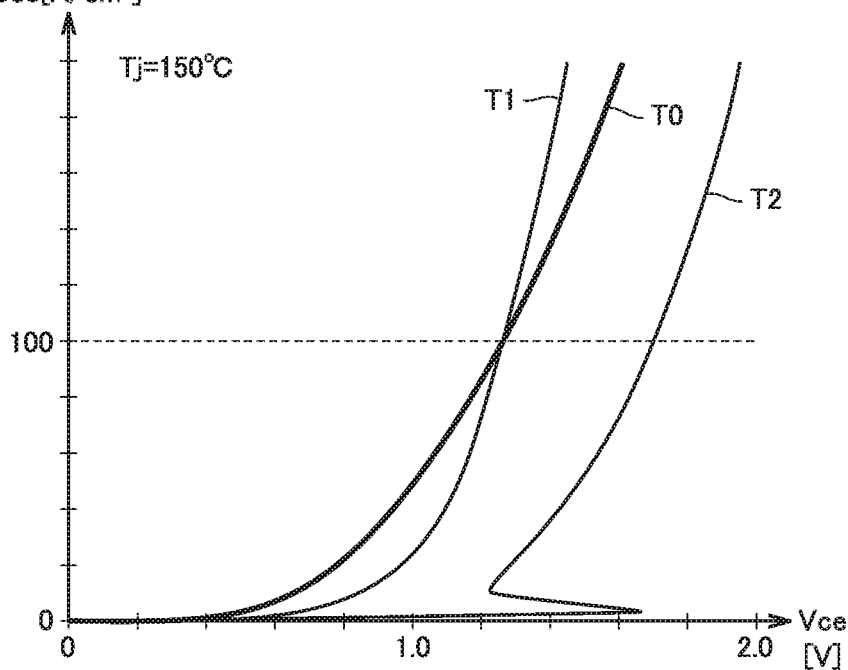
FIG. 14 shows a graph illustrating current and voltage characteristics at the time when the semiconductor device according to the first embodiment is turned on and off in accordance with FIGS. 12 and 13.

FIG. 14 shows a graph illustrating current and voltage characteristics at the time when semiconductor device 200 is turned on and off in accordance with FIGS. 12 and 13.

Referring to FIG. 14, a characteristic line T1 corresponds to a result of simulation of current and voltage characteristics (an I-V curve) when semiconductor device 200 is turned on and off in accordance with FIGS. 12 and 13 by using the models in FIGS. 7 to 10, that is, when semiconductor device 200 is turned on by applying a negative voltage to second gate electrode 54.

A characteristic line T2 corresponds to a result of simulation of current and voltage characteristics (an I-V curve) when semiconductor device 200 is turned on while no negative voltage is applied (Vg2=0) to second gate electrode 54 (that is, the condition in FIG. 11B) by using the models in FIGS. 7 to 10.

A characteristic line T0 shows current and voltage characteristics (an I-V curve) of a general IGBT of the single-gate structure in which no second gate electrode is disposed on the second main surface side (the side of the collector electrode). Characteristic line T0 is obtained by simulating such a structure that p collector 44 covers the entire surface of collector electrode 51 on the second main surface side in the models in FIGS. 7 to 10.

Based on comparison between characteristic lines T1 and T2, by turning on semiconductor device 200 by applying a negative voltage to second gate electrode 54 as described also in comparison between FIGS. 11B and 11D, an on voltage which is collector voltage Vce while collector current Ic flows can be lowered and the snapback phenomenon can also be suppressed.

Based on comparison between characteristic lines T0 and T1 in a region where a condition of Jce=100 (A/cm$^2$) or higher is satisfied, semiconductor device 200 which performs an on operation by application of a negative voltage to second gate electrode 54 can be expected to be lower in on voltage than the conventional IGBT of the single-gate structure. Semiconductor device 200 of the double-gate structure according to the first embodiment can achieve reduced conduction loss when a high current conducts.

In FIGS. 12 and 13, on and off of semiconductor device 200 is controlled by combination of application and stop of application of positive voltage $\alpha$ (V) to first gate electrode 48 and application and stop of application of negative voltage $-\beta$ (V) to second gate electrode 54. Therefore, by setting absolute values of the positive voltage and the negative voltage to be equal to each other (that is, $\alpha=\beta$), a configuration of drive control circuit 300 (FIG. 6) which generates first gate voltage Vg1 and second gate voltage Vg2 can be simplified.

Semiconductor device 200 can be maintained in the on state by an electrical conduction path from collector electrode 51 through the J1 junction formed by p collector 44 and n base 41, even though application of the negative voltage ($-\beta$ (V)) to second gate electrode 54 is stopped after turn-on in accordance with the operation waveform in FIG. 12.

When second gate voltage Vg2 is maintained at $-\beta$ (V) during the on operation period of semiconductor device 200 as described with reference to FIG. 14, however, power loss due to lowering in on voltage can be suppressed. When the condition of Vg2=$-\beta$ (V) is maintained, on the other hand, as compared with the example in which the condition of Vg2=0 (V) is set, there is a concern about increase in power consumption in drive control circuit 300 (FIG. 6). Therefore, a gate voltage during the on operation period of semiconductor device 200 can also be controlled as in FIG. 15.

Figure 15:
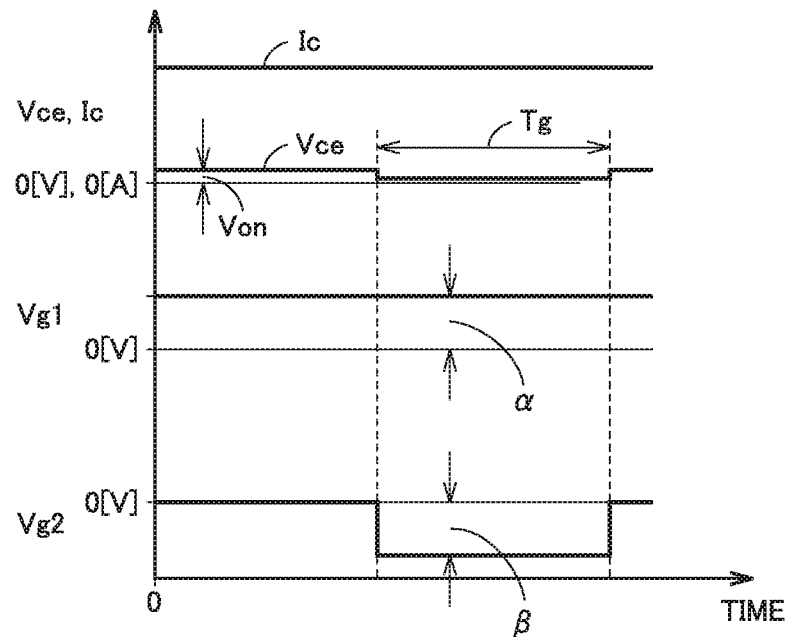
FIG. 15 is an operation waveform diagram illustrating gate voltage control for suppressing power consumption during an on operation period of the semiconductor device according to the first embodiment.

Referring to FIG. 15, during the on operation period of semiconductor device 200 in which the condition of first gate voltage Vg1=$\alpha$ (V) is satisfied, that is, during a period in which collector current Ic is generated, both of a period in which the condition of Vg2=0 (V) is satisfied and a period in which a condition of Vg2=$-\beta$ (V) is satisfied can be provided for second gate voltage Vg2 applied to second gate electrode 54.

Since collector voltage Vce (that is, an on voltage Von) during a period Tg in which Vg2 is controlled to Vg2=$-\beta$ (V) is lower than the collector voltage during a period in which the condition of Vg2=0 (V) is satisfied, power loss (conduction loss) produced in semiconductor device 200 (IGBT) due to passage of collector current Ic can be suppressed. By providing a period Tg during which the condition of Vg2=$-\beta$ (V) is satisfied in a part of the on operation period of semiconductor device 200, power consumption in drive control circuit 300 (FIG. 6) which supplies second gate voltage Vg2 can be suppressed.

In particular, by providing period Tg in correspondence with a period during which collector current Ic is high, conduction loss in the IGBT and power consumption in drive control circuit 300 can also efficiently be lowered. For example, drive control circuit 300 can be configured to control Vg2 to Vg2=$-\beta$ (V) during a period in which collector current Ic is higher than the reference value and to control Vg2 to Vg2=0 (V) during a period in which collector current Ic is equal to or lower than the reference value in accordance with a detected value (FIG. 6) of collector current Ic input to drive control circuit 300 during the on operation period of semiconductor device 200.

Control for suppressing a leak current during the off operation period of semiconductor device 200 will now be described.

Referring again to FIG. 5, semiconductor device 200 forms a voltage blocking state (off state) by the depletion layer formed around the J2 junction formed by n base 41 and p base 42 which holds a voltage while a voltage higher than a voltage of emitter electrode 50 is applied to collector electrode 51 (Vce>0).

When a current (leak current Ileak in FIGS. 13 and 14) is generated between collector electrode 51 and the emitter electrode by a leakage current at the J2 junction during the off operation by semiconductor device 200, power loss is produced. Therefore, suppression of the leakage current is important.

Increase in difference in impurity density in the J2 junction (that is, a difference in impurity density between n base 41 and p base 42) brings about a higher barrier for a junction potential, and hence a leakage current in the J2 junction is lowered. Since the leakage current in the J2 junction functions as a base current of a pnp transistor implemented by p collector 44, n base 41, and p base 42, the collector current of the pnp transistor is amplified. The collector current becomes a main component of leak current Ileak.

Therefore, in order to lower leak current Ileak, it is effective to suppress a leakage current, in the J2 junction by increasing an impurity density in p base 42 by applying a voltage negative with respect to emitter electrode 50 to first gate electrode 48. Furthermore, it is also effective to lower leak current Ileak to lower an amplification factor of the pnp transistor described above by lowering an electrical resistance of second gate channel region 53 disposed in parallel to the J1 junction formed by p collector 44 and n base 41 by applying a voltage positive with respect to collector electrode 51 to second gate electrode 54.

Figure 16:
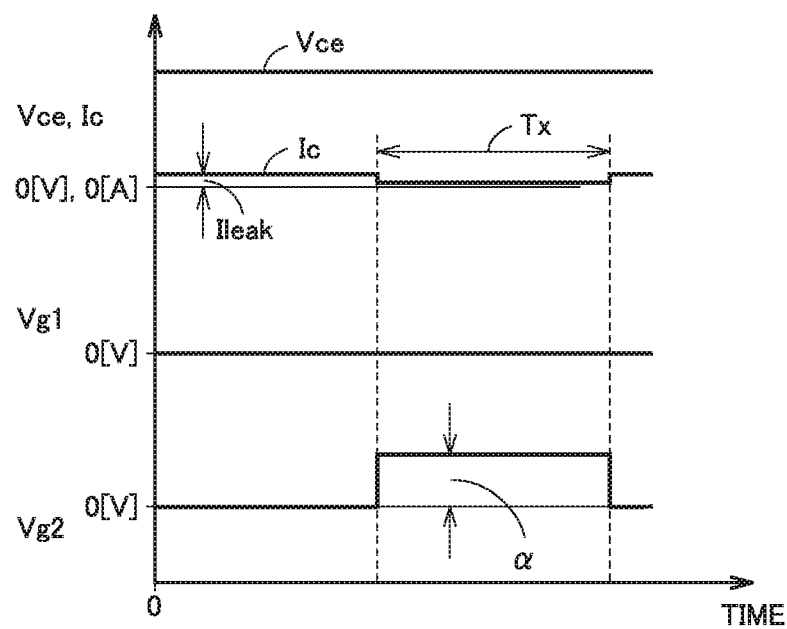
FIG. 16 is an operation waveform diagram illustrating gate voltage control for suppressing a leak current during an off operation period of the semiconductor device according to the first embodiment.

FIG. 16 shows an operation waveform diagram illustrating gate voltage control for suppressing a leak current during the off operation period of the semiconductor device according to the first embodiment.

Referring to FIG. 16, during the off operation period of semiconductor device 200 in which a condition of first gate voltage Vg1=0 (V) is satisfied, both of a period in which the condition of Vg2=0 (V) is satisfied and a period in which the condition of Vg2=α (V) is satisfied can be provided for second gate voltage Vg2 applied to second gate electrode 54. For second gate voltage Vg2, both of a period in which a voltage (Vg2=α (V)) reverse in polarity to a voltage (Vg2=−β (V)) for not forming a channel in second gate channel region 53 is generated and a period in which a voltage as high as a voltage of collector electrode 51 (Vg2=0 (V)) is generated are provided.

During a period Tx in which Vg2 is controlled to Vg2=α (V), collector voltage Vce (that is, leak current Ileak) is lower than the collector voltage during a period in which the condition of Vg2=0 (V) is satisfied. Therefore, power loss produced in semiconductor device 200 due to a leakage current can be suppressed.

In particular, in order to suppress stand-by electric power in an apparatus to which semiconductor device 200 is applied, a stand-by mode may be applied during a switch-off period of the apparatus. For example, drive control circuit 300 can be configured to provide period Tx in which the condition of Vg2=α (V) is satisfied in correspondence with a period of application of the stand-by mode by inputting a signal indicating that the stand-by mode is being applied to drive control circuit 300 (FIG. 6).

Modification of First Embodiment

In a modification of the first embodiment, gate voltage control for suppressing fluctuation in current and voltage at the time of turn-on and turn-off of semiconductor device 200 will further be described.

A result of simulation of an operation at the time when semiconductor device 200 turns on and off a current which passes through a reactor load will initially be described by using a model similar to that in FIGS. 7 to 10 in the first embodiment.

FIGS. 18 to 27 show simulated waveforms of a switching operation when a current at 100 (A) is turned off in accordance with FIG. 13 by connecting semiconductor device 200 (IGBT) of the double-gate structure according to the first embodiment to an inductance load and a DC power supply of 600 (V). When semiconductor device 200 is turned off, first gate voltage Vg1 is varied from α (V) to 0 (V) and second gate voltage Vg2 is varied from −β (V) to 0 (V).

FIGS. 18 to 27 show results of simulation with a difference in timing of variation in element temperature (junction temperature) T, First gate voltage Vg1, and second gate voltage Vg2 being varied. FIG. 17 shows a list of simulation conditions in FIGS. 18 to 27. Each of FIGS. 18 to 27 shows with a solid line, a simulated waveform of collector current Ic and collector voltage Vce when semiconductor device 200 according to the first embodiment is turned off. For comparison, a waveform of collector current Ic and collector voltage Vce at the time of turn-off of the general IGBT of the single-gate structure simulated as in FIG. 14 is shown with a dotted line.

FIGS. 18 to 22 show simulated waveforms under the condition of T=25° C. Under the condition of T=25° C., magnitude of a surge voltage Vsg (turn-off surge) is varied depending on timing of variation in first gate voltage Vg1 and second gate voltage Vg2.

Figure 18:
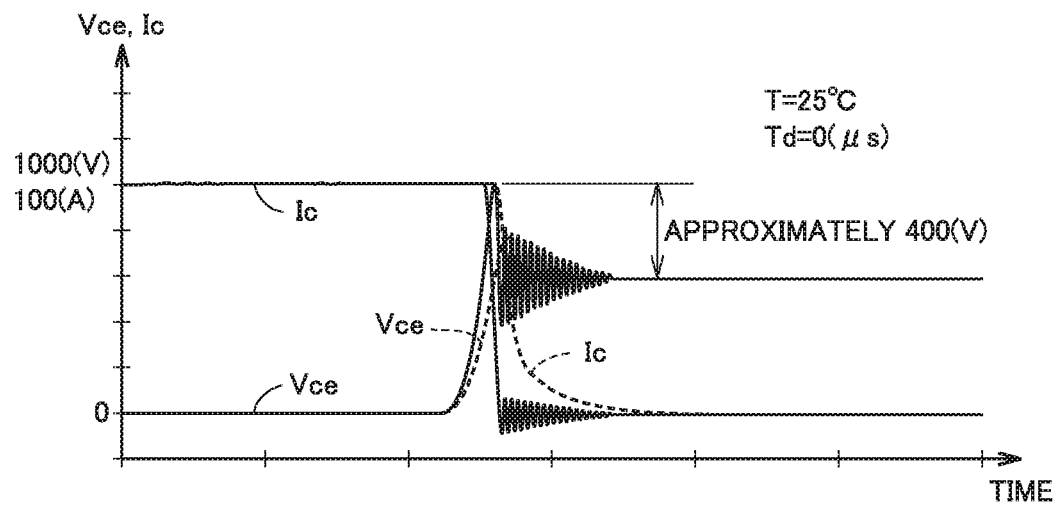
FIG. 18 is a first operation waveform diagram showing a result of simulation of the semiconductor device according to the first embodiment.

FIG. 18 shows a simulated waveform at the time when timing of variation in first gate voltage Vg1 and timing of variation in second gate voltage Vg2 are the same. In FIG. 18, Vsg is set to approximately 400 (V).

Figure 19:
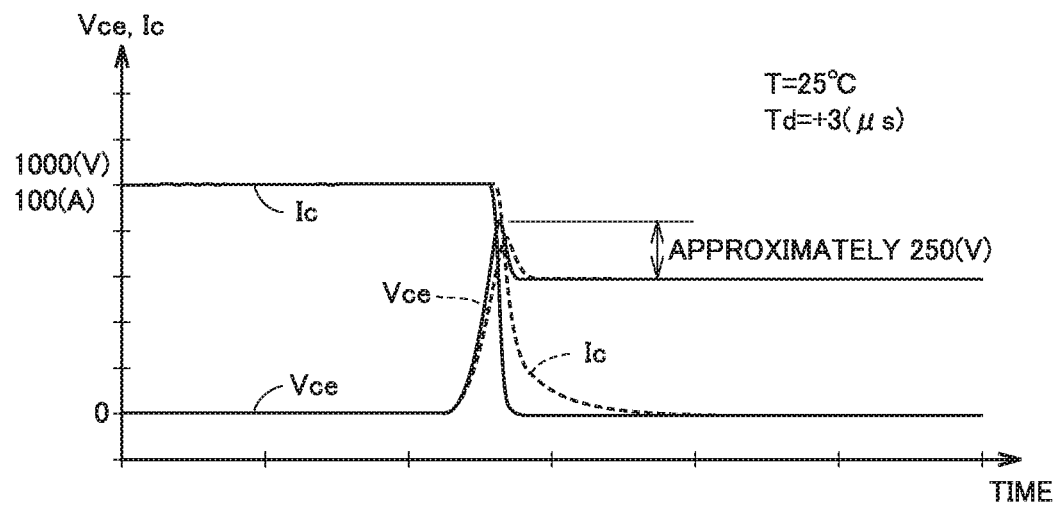
FIG. 19 is a second operation waveform diagram showing a result of simulation of the semiconductor device according to the first embodiment.

FIG. 19 shows a simulated waveform at the time when second gate voltage Vg2 is varied with delay of 3 (μs) after timing of variation in first gate voltage Vg1, that is, when delay time Td is 3 (μs). In FIG. 19, Vsg is set to approximately 250 (V).

Figure 20:
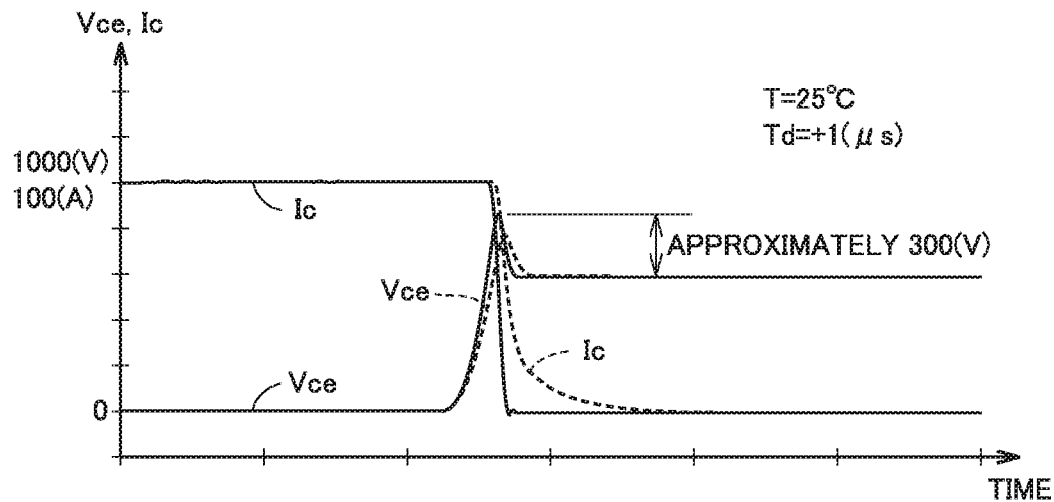
FIG. 20 is a third operation waveform diagram showing a result of simulation of the semiconductor device according to the first embodiment.

FIG. 20 shows a simulated waveform at the time when second gate voltage Vg2 is varied with delay of 1 (μs) after timing of variation in first gate voltage Vg1, that is, when delay time Td is 1 (μs). in FIG. 20, Vsg is set to approximately 300 (V).

Figure 21:
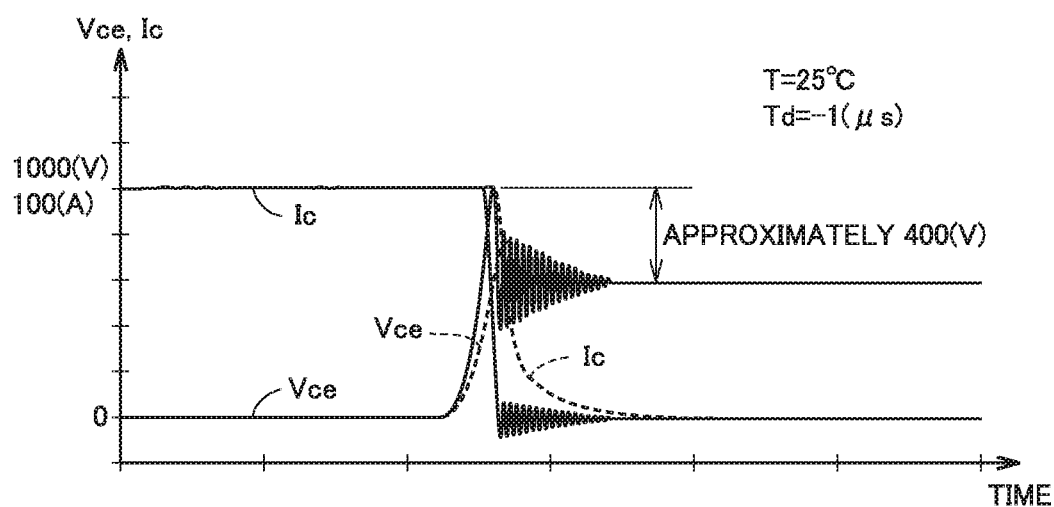
FIG. 21 is a fourth operation waveform diagram showing a result of simulation of the semiconductor device according to the first embodiment.

FIG. 21 shows a simulated waveform at the time when second gate voltage Vg2 is varied earlier by 1 (μs) than timing of variation in first gate voltage Vg1, that is, when delay time Td is −1 (μs). In FIG. 21, Vsg is set to approximately 400 (V).

Figure 22:
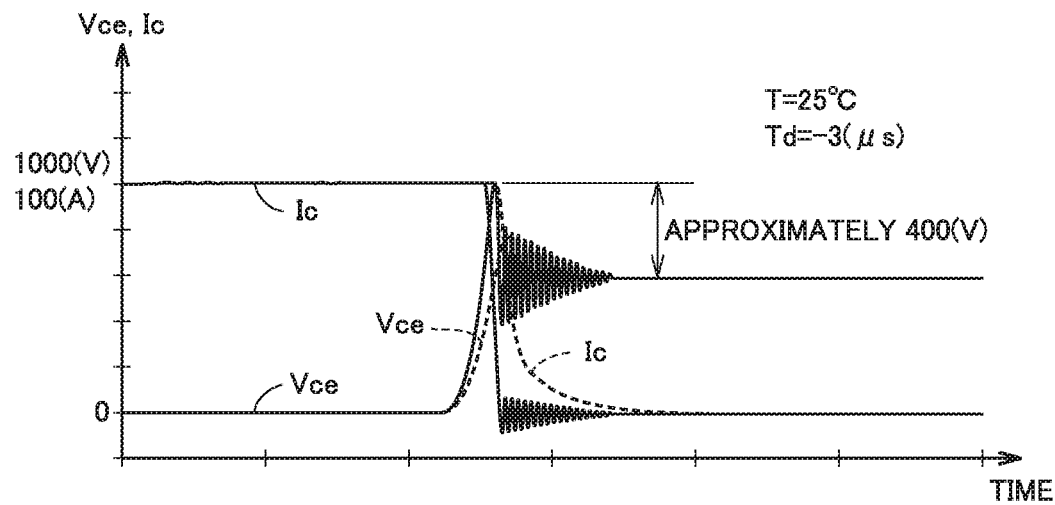
FIG. 22 is a fifth operation waveform diagram showing a result of simulation of the semiconductor device according to the first embodiment.

FIG. 22 shows a simulated waveform at the time when second gate voltage Vg2 is varied earlier by 3 (μs) than timing of variation in first gate voltage Vg1. that is, when delay time Td is −3 (μs). In FIG. 22, Vsg is set to approximately 400 (V).

FIGS. 23 to 27 show waveforms of simulation under a condition of T=150° C. Under the condition of T=150° C., a surge voltage is not high, and a length of a time period (a turn-off time period Toff) required for turn-off switching is varied depending on timing of variation in first gate voltage Vg1 and second gate voltage Vg2.

Figure 23:
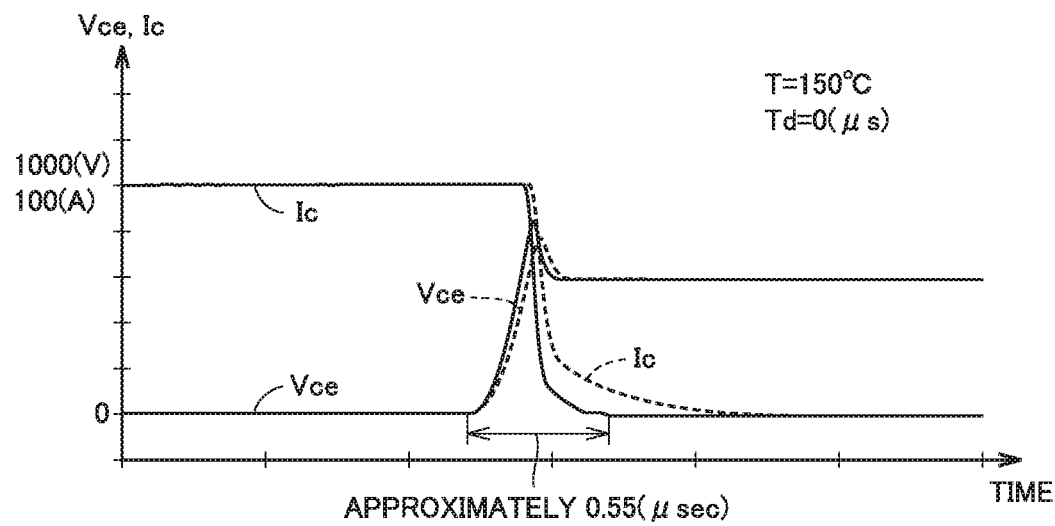
FIG. 23 is a sixth operation waveform diagram showing a result of simulation of the semiconductor device according to the first embodiment.

Similarly to FIG. 18, FIG. 23 shows a simulated waveform at the time when liming of variation in first gate voltage Vg1 and timing of variation in second gate voltage Vg2 are the same. In FIG. 23, Toff is set to approximately 0.55 (µs).

Figure 24:
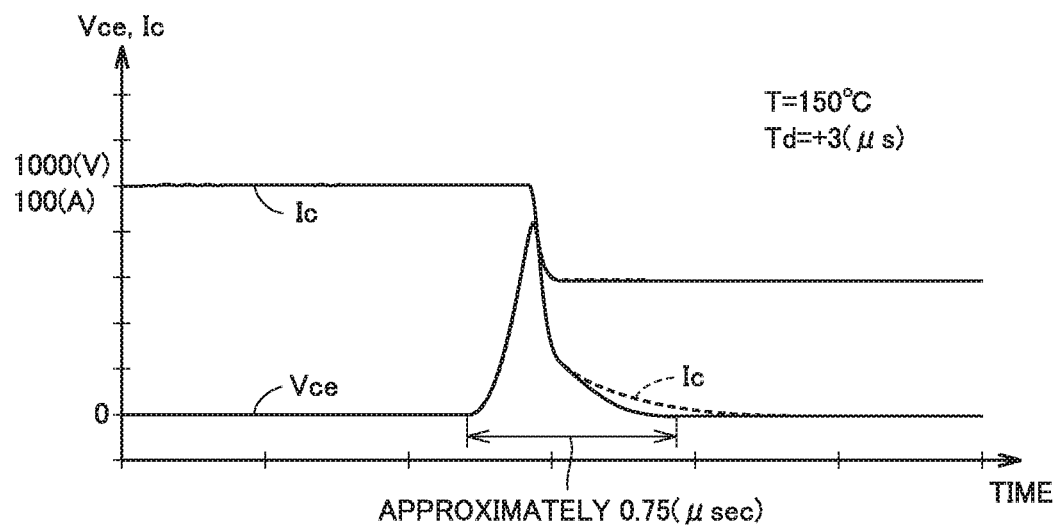
FIG. 24 is a seventh operation waveform diagram showing a result of simulation of the semiconductor device according to the first embodiment.

FIG. 24 shows a simulated waveform at the time when second gate voltage Vg2 is varied with delay of 3 (µs) after timing of variation in first gate voltage Vg1, that is, when delay time Td is 3 (µs), as in FIG. 19. In FIG. 24, Toff is set to approximately 0.75 (µs).

Figure 25:
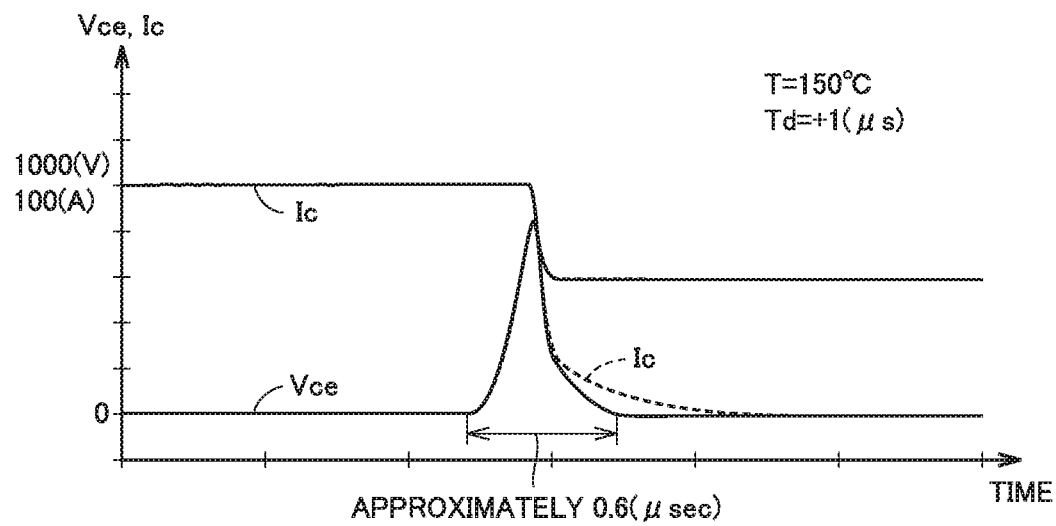
FIG. 25 is an eighth operation waveform diagram showing a result of simulation of the semiconductor device according to the first embodiment.

FIG. 25 shows a simulated waveform at the time when second gate voltage Vg2 is varied with delay of 1 (µs) after timing of variation in first gate voltage Vg1, that is. when delay time Td is 1 (µs), as in FIG, 20. In FIG. 25, Toff is set to approximately 0.6 (µs).

Figure 26:
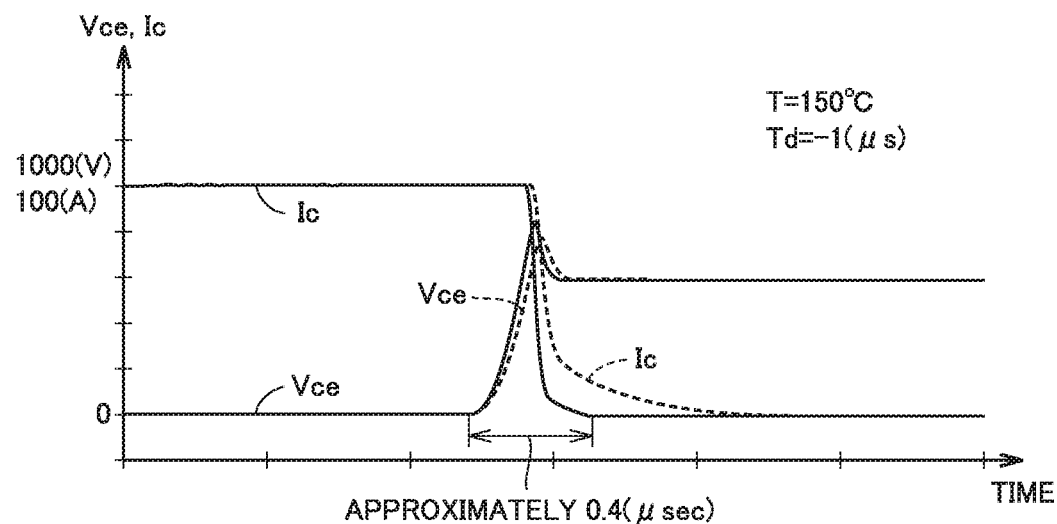
FIG. 26 is a ninth operation waveform diagram showing a result of simulation of the semiconductor device according to the first embodiment.

FIG. 26 shows a simulated waveform at the time when second gate voltage Vg2 is varied earlier by 1 (µs) than timing of variation in first gate voltage Vg1. that is, when delay time Td is −1 (µs), as in FIG. 21. In FIG. 26, Toff is set to approximately 0.4 (µs).

Figure 27:
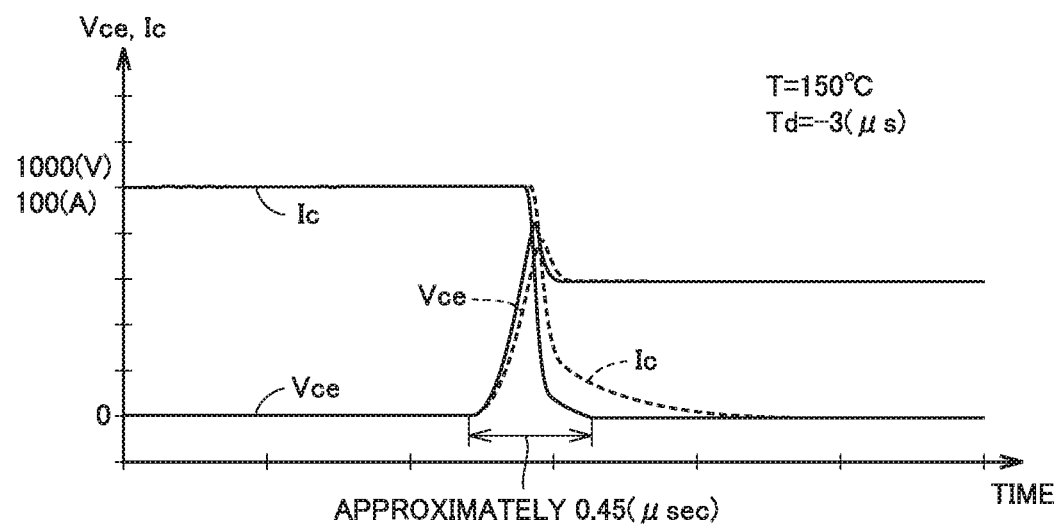
FIG. 27 is a tenth operation waveform diagram showing a result of simulation of the semiconductor device according to the first embodiment.

FIG. 27 shows a simulated waveform at the time when second gate voltage Vg2 is varied earlier by 3 (µs) than timing of variation in first gate voltage Vg1, that is, when delay time Td is −3 (µs), as in FIG. 22. In FIG. 27, Toff is set to approximately 0.45 (µs).

Referring again to FIG. 17, surge voltage Vsg under each simulation condition of T=25° C. (FIGS. 18 to 22) and turn-off time period Toff under each simulation condition of T=150° C. (FIGS. 23 to 27) are further shown in FIG. 17.

It is understood from the results of simulation that, as delay time Td is longer, that is, variation in second gate voltage Vg2 (from −β (V) to 0 (V)) is later than variation in first gate voltage Vg1 (from α (V) to 0 (V), the surge voltage is lower whereas the turn-off time period is longer.

Therefore, basically, at the time of turn-off of semiconductor device 200, in order to lower switching loss by reducing a turn-off time periods second gate voltage Vg2 is preferably varied from −β (V) to 0 (V) before first gate voltage Vg1 is varied from α (V) to 0 (V) as described in the first embodiment (FIG. 13).

It is understood, on the other hand, that, when semiconductor device 200 is used in an application in which suppression of a surge voltage is required, in contrast to the above, at the time of turn-off of semiconductor device 200, second gate voltage Vg2 is preferably varied from −β (V) to 0 (V) after first gate voltage Vg1 is varied from α (V) to 0 (V).

Such an effect of suppression of a surge voltage is achieved by adjustment of an amount of electrons excessively accumulated in n base 41 and emitted to collector electrode 51 through second gate channel region 53. Therefore, the surge voltage can also be lowered by finely controlling a rate of emission of excessive electrons based on magnitude of a value of an electrical resistance of second gate channel region 53 and a length of a time period during which a channel is formed and not formed. Specifically, magnitude of a value of an electrical resistance of second gate channel region 53 can be controlled by magnitude of second gate voltage Vg2, and a length of a time period during which a channel is formed and not formed can be controlled based on a duration of application of second gate voltage Vg2.

On the other hand, an amount of excessive electrons accumulated in n base 41 is dependent also on an amount of electrons injected through first gate channel region 56. Therefore, a surge voltage can be lessened by finely controlling magnitude of a value of an electrical resistance of first gate channel region 56 and a length of a time period during which a channel is formed and nor formed based on magnitude and a duration of application of first gate voltage Vg1.

In the modification of the first embodiment, as described in the first embodiment (FIG. 13), gate voltage control for suppressing a surge voltage under a condition that second gate voltage Vg2 is varied before variation in first gate voltage Vg1 in order to lower switching loss will be described.

Figure 28:
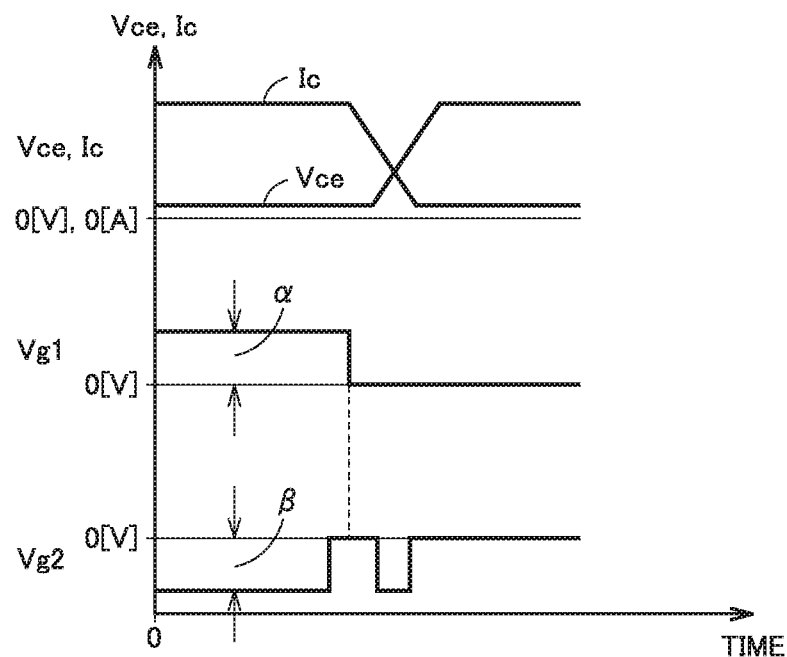
FIG. 28 is an operation waveform diagram at the time of turn-off which illustrates a first example of gate voltage control according to a modification of the first embodiment.

FIG. 28 is an operation waveform diagram at the time of turn-off which illustrates a first example of gate voltage control according to the modification of the first embodiment.

Referring to FIG. 28, when semiconductor device 200 is turned off, drive control circuit 300 (FIG. 6) varies second gate voltage Vg2 from −β (V) to 0 (V) and thereafter varies first gate voltage Vg1 from α (V) to 0 (V), After the condition of first gate voltage Vg1=0 (V) and second gate voltage Vg2=0 (V) is satisfied, at least one period during which a negative voltage is again supplied to collector electrode 51 is provided.

Thus, by providing at least one period during which second gate voltage Vg2 for not forming a channel in second gate channel region 53 is generated after stop of generation of first gate voltage Vg1 for forming a channel in first gate channel region 56 and second gate voltage Vg2 for not forming a channel in second gate channel region 53, an amount of emission of electrons through second gate channel region 53 after prompt start of the turn-off operation is decreased, so that a rate of increase in collector voltage Vce can be suppressed and a surge voltage at the time of turn-off can be lessened.

Figure 29:
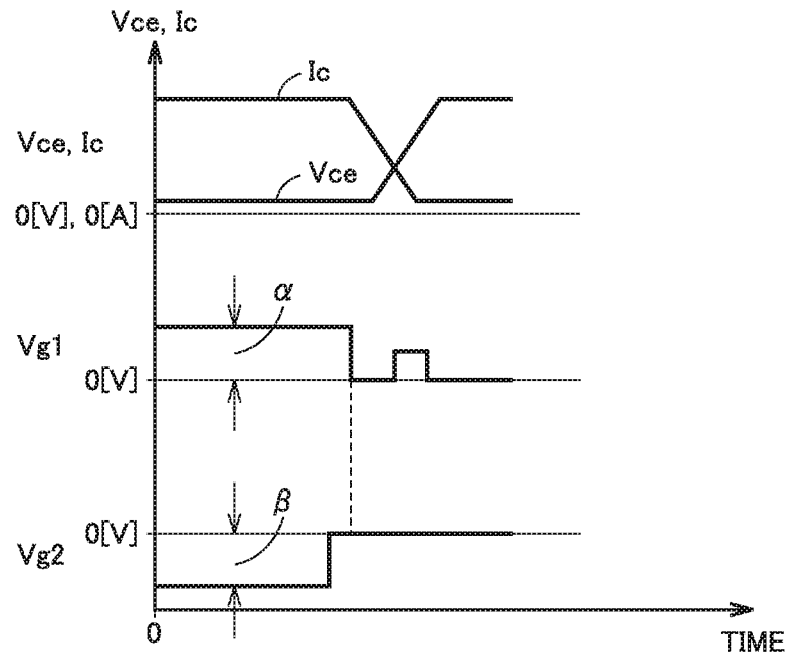
FIG. 29 is an operation waveform diagram at the time of turn-off which illustrates a second example of gate voltage control according to the modification of the first embodiment.

FIG. 29 is an operation waveform diagram at the time of turn-off which illustrates a second example of gate voltage control according to the modification of the first embodiment.

Referring to FIG. 29, when semiconductor device 200 is turned off, as in FIG. 28, a surge voltage can be lessened also by providing at least one period during which a voltage positive with respect to emitter electrode 50 is again supplied to first gate electrode 48 after the condition of first gate voltage Vg1=0 (V) and second gate voltage Vg2=0 (V) is satisfied, that is, by providing at least one period during which first gate voltage Vg1 for forming a channel in first gate channel region 56 is generated after stop of generation of first gate voltage Vg1 for forming a channel in first gate channel region 56 and second gate voltage Vg2 for not forming a channel in second gate channel region 53.

By suppressing a rate of increase in collector voltage Vce by providing a period during which electrons are injected into n base 41 through first gate channel region 56 during the turn-off operation, a surge voltage can be lessened. During that period, first gate voltage Vg1 is preferably lower than the voltage in the on operation (α (V)) such that electrons injected through first gate channel region 56 are not excessive.

In turning off semiconductor device 200, both of adjustment of second gate voltage Vg2 in FIG. 28 and adjustment of first gate voltage Vg1 in FIG. 29 may be combined.

When semiconductor device 200 is turned on, a gate voltage can be controlled to suppress jump, that is, abrupt increase, in collector current Ic.

Figure 30:
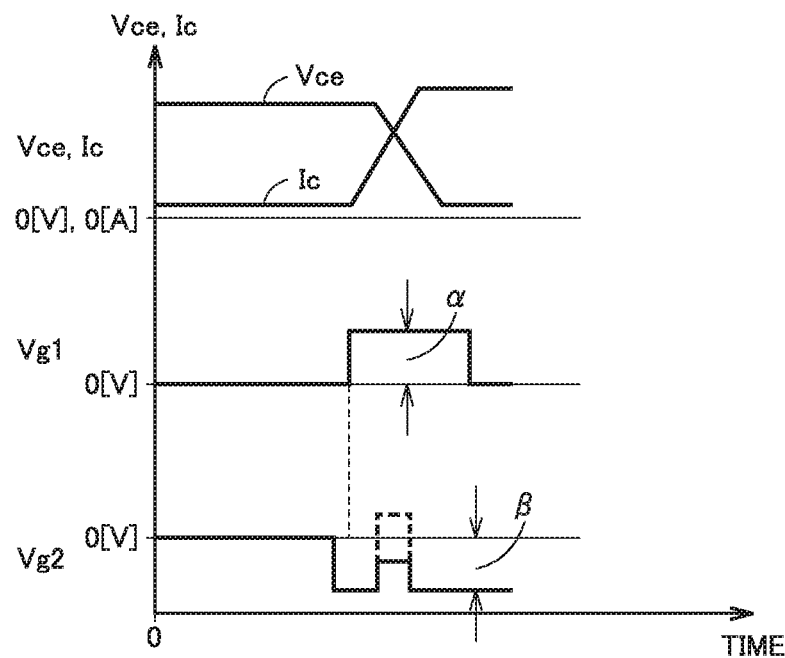
FIG. 30 is an operation waveform diagram at the time of turn-on which illustrates a third example of gate voltage control according to the modification of the first embodiment.

FIG. 30 is an operation waveform diagram at the time of turn-on which illustrates a third example of gate voltage control according to the modification of the first embodiment.

Referring to FIG. 30, when semiconductor device 200 is turned on, as described in the first embodiment (FIG. 12), after drive control circuit 300 (FIG 6) varies second gate voltage Vg2 from 0 (V) to −β (V), first gate voltage Vg1 is varied from 0 (V) to α (V). After the condition of first gate voltage Vg1=α (V) and second gate voltage Vg2=−β (V) is satisfied, at least one period during which second gate voltage Vg2 is increased from −β (V) is provided. During that period, second gate voltage Vg2 may be set to any of a voltage positive with respect to collector electrode 51, a voltage equal to the voltage of collector electrode 51, and a voltage negative with respect to collector electrode 51 and smaller in absolute value than β.

As described in control for suppressing a leak current in connection with FIG. 16, when second gate voltage Vg2 is increased from −β (V) to lower an electrical resistance of second gate channel region 53, an amplification factor of the pnp transistor constituted of p collector 44, n base 41, and p base 42 is lowered. Therefore, by providing a period during which second gate voltage Vg2 is increased from −β (V) after start of the turn-on operation, a rate of increase in collector current Ic which flows from collector electrode 51 to emitter electrode 50 can be suppressed.

Thus, in the turn-on operation, jump of collector current Ic at the time of turn-on can be suppressed by providing at least one period during which generation of second gate voltage Vg2 for not forming a channel in second gate channel region 53 is stopped during a period in which first gate voltage Vg1 for forming a channel in first gate channel region 56 is generated.

Figure 31:
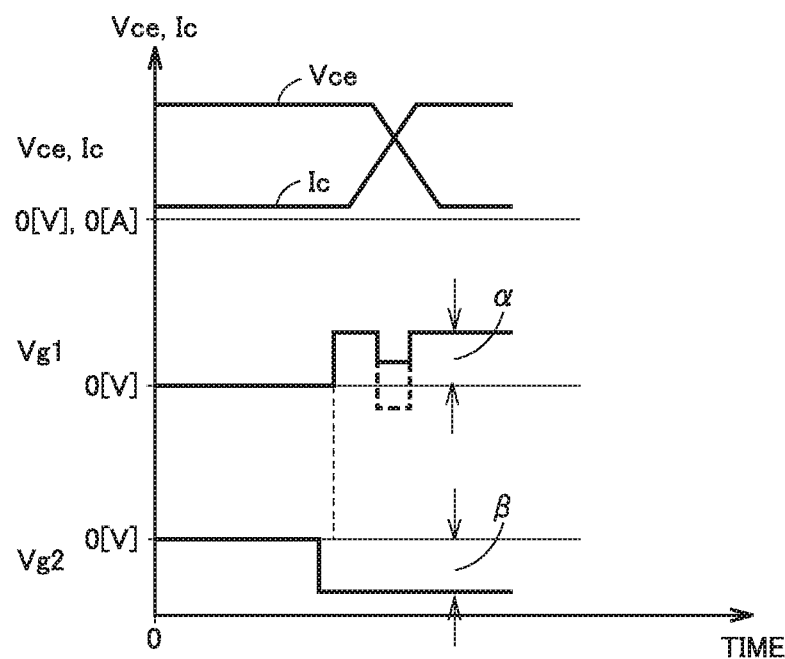
FIG. 31 is an operation waveform diagram at the time of turn-on which illustrates a fourth example of gate voltage control according to the modification of the first embodiment.

FIG. 31 is an operation waveform diagram at the time of turn-on which illustrates a fourth example of gate voltage control according to the modification of the first embodiment.

Referring to FIG. 31, when semiconductor device 200 is turned on, jump of collector current Ic can be suppressed also by providing at least one period during which first gate voltage Vg1 is lowered from α (V) after the condition of first gate voltage Vg1=α (V) and second gate voltage Vg2=−β (V) is satisfied as in FIG. 30. During that period, first gate voltage Vg1 may be set to any of a voltage negative with respect to emitter electrode 50, a voltage equal to that of emitter electrode 50, and a voltage positive with respect to emitter electrode 50 and smaller in absolute value than α.

When an electrical resistance of first gate channel region 56 is increased to decrease electrons injected into n base 41 through first gate channel region 56 by providing a period during which first gate voltage Vg1 is lowered from α (V), a base current of the pnp transistor constituted of p base 42, n base 41, and p collector 44 is lowered and current conduction capability is lowered. Therefore, also by providing a period during which first gate voltage Vg1 is lowered from α (V) after start of the turn-on operation, current conduction capability of the pnp transistor constituted of p base 42, n base 41 and p collector 44 is lowered so that a rate of increase in collector current Ic which flows from collector electrode 51 to emitter electrode 50 is suppressed and jump of collector current Ic at the time of turn-on can be suppressed.

In turning on semiconductor device 200, both of adjustment of second gate voltage Vg2 in FIG. 30 and adjustment of first gate voltage Vg1 in FIG. 31 may also be combined.

Second Embodiment

In a second embodiment, a modification of a cell structure of semiconductor device 200 according to the first embodiment will be described. Since each semiconductor device shown in the second embodiment is different from semiconductor device 200 according to the first embodiment only in a part of a cross-sectional structure (double-gate structure), the cell structure will be described with reference to a partial cross-sectional view as in FIG. 5. Each element of the semiconductor device described in the second embodiment can basically be formed of a material the same as that for an element identical in name in semiconductor device 200 according to the first embodiment.

First Example

Figure 32:
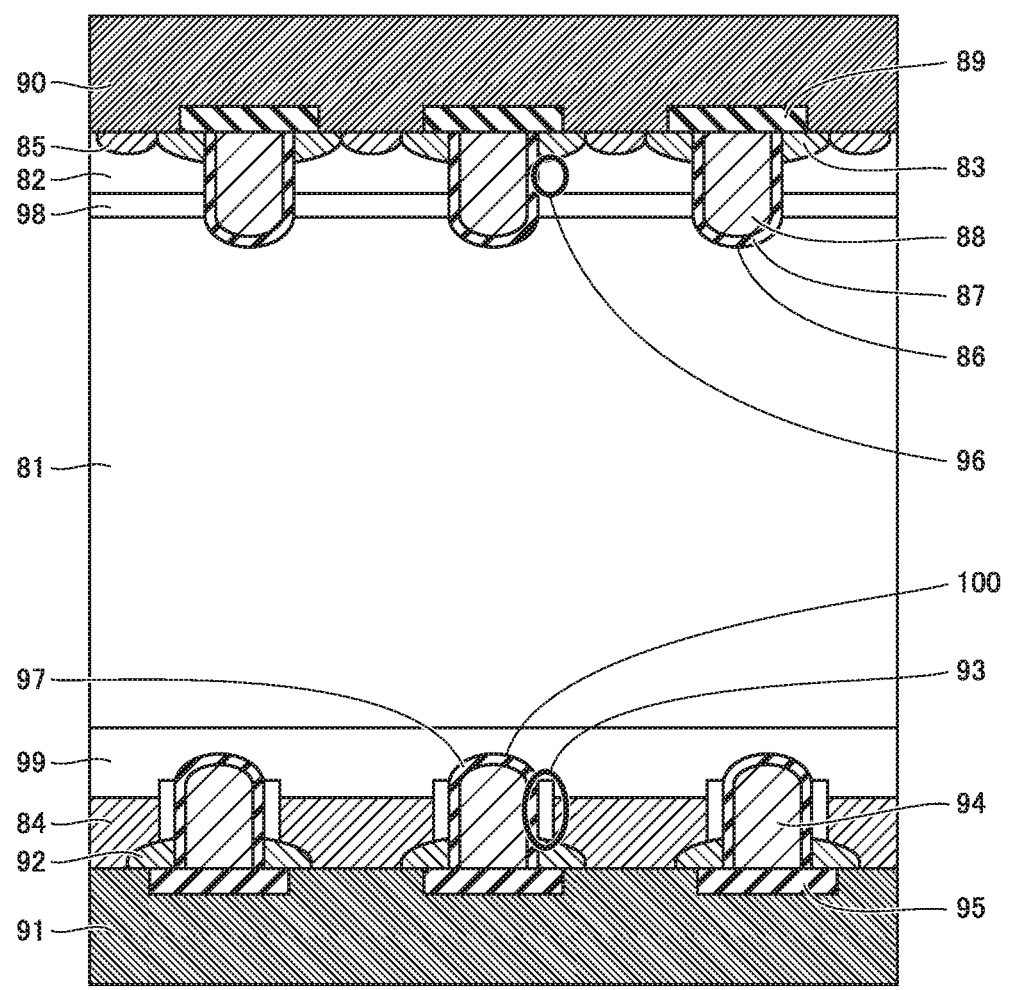
FIG. 32 is a partial cross-sectional view of a semiconductor device according to a first example of a second embodiment.

FIG. 32 is a partial cross-sectional view of a semiconductor device of the double-gate structure according to a first example of the second embodiment. FIG. 32 is a cross-sectional view similar to FIG. 5.

Referring to FIG. 32, a semiconductor device 200a according to the first example of the second embodiment is different from the double-gate structure according to the first embodiment in that a second gate on the second main surface side (the collector electrode side) is formed to have a trench gate structure similarly to the first gate on the first main surface side (the emitter electrode side).

Semiconductor device 200a according to the first example of the second embodiment includes an n base 81 including first and second main surfaces, a p base 82, an n emitter 83, a p collector 84, a p emitter 85, a first trench 86, a first gate insulating film 87, a first gate electrode 88, a first gate interlayer insulating film 89, an emitter electrode 90, a collector electrode 91, an n collector 92, a second trench 100. a second gate electrode 94, a second gate interlayer insulating film 95, a second gate insulating film 97, an n-type charge accumulation layer 98, and an n buffer 99.

In semiconductor device 200a, n base 81 corresponds to one example of the "first semiconductor layer," the n-type corresponds to the "first conductivity type," and the p-type corresponds to the "second conductivity type." P base 82 is disposed on the first main surface of n base 81 and corresponds to one example of the "second semiconductor layer." N emitter 83 is selectively disposed in a surface of p base 82 and corresponds to one example of the "third semiconductor layer." P emitter 85 at a high concentration is selectively provided in the surface (on the first main surface side) of p base 82 for establishing good Ohmic contact with emitter electrode 90.

Emitter electrode 90 is disposed on an upper surface (on the first main surface side) of p base 82 and n emitter 83 and arranged on the first main surface of semiconductor device 200a. Emitter electrode 90 corresponds to one example of the "first main electrode."

First trench 86 is formed to reach n base 81 from a surface of n emitter 83 through p base 82 and n-type charge accumulation layer 98. First gate insulating film 87 is formed on a surface of first trench 86. in the inside of first trench 86, first gate electrode 88 is formed on first gate insulating film 87 (on the first main surface side). As in semiconductor device 200, first gate electrode 88 has a trench gate structure. First gate electrode 88 corresponds to one example of the "first control electrode" and first gate insulating film 87 corresponds to one example of the "first gate insulating film."

A first gate channel region 96 is formed in a region in p base 82 between n base 81 and n emitter 83. In first gate channel region 96, a current path (channel) is formed or not formed in accordance with first gate voltage Vg1 applied to first gate electrode 88 with emitter electrode 90 being defined as the reference, as in the first embodiment. Since a behavior of first gate channel region 96 in response to first gate voltage Vg1 is the same as a behavior of first gate channel region 56 in the first embodiment, detailed description, will not be repeated.

P collector 84 is disposed in the second main surface of n base 81. P collector 84 corresponds to one example of the "fourth semiconductor layer." N collector 92 at a high concentration is selectively disposed in a surface (on the second main surface side) of p collector 44 for establishing good Ohmic contact with collector electrode 91 and corresponds to one example of the "fifth semiconductor layer." Collector electrode 91 is disposed on p collector 84 and n collector 92 (on the second main surface side) and arranged on the second main surface of semiconductor device 200a. Collector electrode 91 corresponds to one example of the "second main electrode."

On the second main surface side (on the side of collector electrode 51), second trench 100 is provided to reach n buffer 99 from a surface of n collector 92 through p collector 84. Second gate insulating film 97 is formed on a surface of second trench 100. In the inside of second trench 100, second gate electrode 94 is formed on second gate insulating film 97 (on the second main surface side). Therefore, in semiconductor device 200a, second gate electrode 94 has a trench gate structure similarly to first gate electrode 88. Second gate electrode 94 corresponds to one example of the "second control electrode" and second gate insulating film 97 corresponds to one example of the "second gate insulating film."

Charge accumulation layer 98 is an n-type semiconductor layer disposed between n base 81 and p base 82 and being higher in impurity density than n base 81, and corresponds to one example of the "sixth semiconductor layer." N-type charge accumulation layer 98 is formed as being smaller in thickness than p base 82. A thickness of p base 82 can be defined as a shortest dimension between a junction surface of p base 82 and charge accumulation layer 98 and a junction surface of p base 82 and n emitter 83. N-type charge accumulation layer 98 corresponds to one example of the "sixth semiconductor layer."

N buffer 99 is an n-type semiconductor layer disposed between n base 81 and p collector 84 and being higher in impurity density than n base 81, and corresponds to one example of the "seventh semiconductor layer." N buffer 99 is formed as being greater in thickness than p collector 84. A thickness of p collector 84 can be defined as a depth dimension from the surface of p collector 84 on the second main surface side.

An n-type second gate channel region 93 is provided between n buffer 99 connected to n base 81 and n collector 92. In second gate channel region 93, n-type second gate channel region 93 in which a channel is formed or not formed in accordance with second gate voltage Vg2 applied to second gate electrode 94 with collector electrode 91 being defined as the reference is provided. Since a behavior of second gate channel region 93 in response to second gate voltage Vg2 is the same as the behavior of second gate channel region 53 in the first embodiment, detailed description will not be repeated.

Turn-on and turn-off also of semiconductor device 200a according to the first example of the second embodiment can be controlled by controlling first gate voltage Vg1 and second gate voltage Vg2 as in the first embodiment and the modification thereof.

According to semiconductor device 200a according to the first example of the second embodiment, a value of an electrical resistance of second gate channel region 93 can be lowered by increasing a density of n-channels in second gate channel region 93 by constructing second gate electrode 94 to have the trench gate structure. Consequently, since a rate of emission of electrons accumulated in n base 81 to collector electrode 91 can be increased at the time of turn-off of semiconductor device 200a, switching loss during the turn-off time period and at the time of turn-off can be reduced.

By providing n-type charge accumulation layer 98, a barrier which prevents holes in n base 81 from flowing out to p base 82 can equivalently be provided. Since a density of charges accumulated in n base 81 can thus be increased during the on operation of semiconductor device 200a, on voltage Von can be lower than in the double-gate structure (the first embodiment) in which no charge accumulation layer 98 is provided.

Furthermore, by providing n buffer 99 in semiconductor device 200a, n base 81 can be decreased in thickness without lowering voltage blocking capability during the off operation period. On voltage Von can thus be lower than in the double-gate structure (the first embodiment) where n buffer 99 is not provided.

In a structure in which n buffer 99 is not arranged in semiconductor device 200a in FIG. 32, the second gate on the second main surface side can also be provided to have the trench gate structure as in FIG. 32. In this case, second trench 100 can be provided to reach n base 81 from the surface of n collector 92 through p collector 84. Thus, an effect of a faster turn-off operation by adoption of the trench gate structure described above can be achieved.

Second Example

Figure 33:
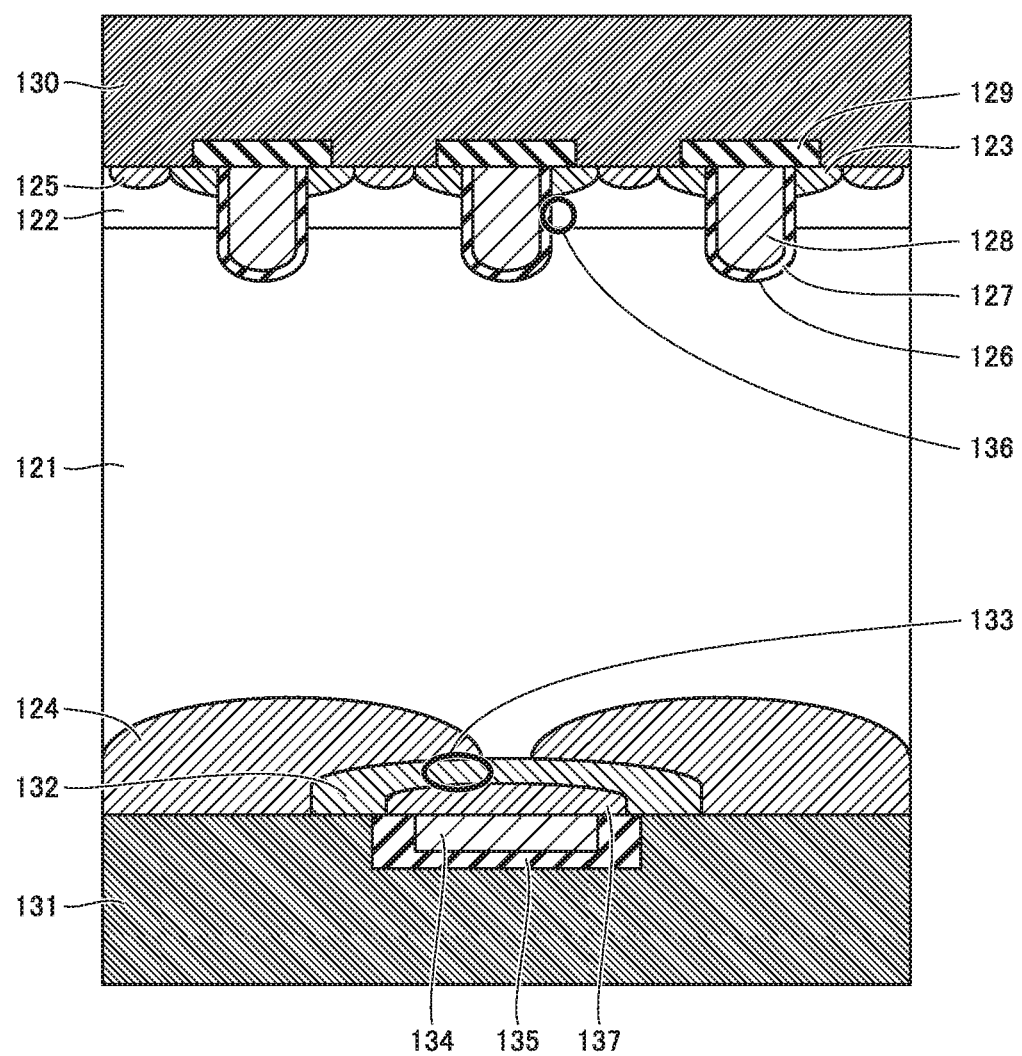
FIG. 33 is a partial cross-sectional view of a semiconductor device according to a second example of the second embodiment.

FIG. 33 is a partial cross-sectional view of a semiconductor device of the double-gate structure according to a second example of the second embodiment.

Referring to FIG. 33, a semiconductor device 200b according to the second example of the second embodiment is different from the double-gate structure according to the first embodiment in that a second gate on the second main surface side (the collector electrode side) is formed to have an n-channel junction field effect transistor (JFET) structure.

Semiconductor device 200b according to the second example of the second embodiment includes an n base 121 including first and second main surfaces, a p base 122, an n emitter 123, a p collector 124, a p emitter 125, a trench 126, a first gate insulating film 127, a first gate electrode 128, a first gate interlayer insulating film 129, an emitter electrode 130, a collector electrode 131, an n collector 132, a second gate electrode 134, and a p-type semiconductor region 137.

In semiconductor device 200b, n base 121 corresponds to one example of the "first semiconductor layer," the n-type corresponds to the "first conductivity type," and the p-type corresponds to the "second conductivity type." V base 122 is disposed on the first main surface of n base 121 and corresponds to one example of the "second semiconductor layer." N emitter 123 is selectively disposed in a surface of p base 122 and corresponds to one example of the "third semiconductor layer." P emitter 125 at a high concentration is selectively provided in the surface (on the first main surface side) of p base 122 for establishing good Ohmic contact with emitter electrode 130.

Emitter electrode 130 is disposed on the upper surface (on the first main surface side) of p base 122 and n emitter 123 and arranged on the first main surface of semiconductor device 200b. Emitter electrode 130 corresponds to one example of the "first main electrode."

Trench 126 is provided to reach n base 121 from a surface of n emitter 123 through p base 122. First gate insulating film 127 is formed on a surface of trench 126. In the inside of trench 126, first gate electrode 128 is formed on first gate insulating film 127 (on the first main surface side). As in semiconductor device 200, first gate electrode 128 is formed to have a trench gate structure. The first gate on the first main surface side (the collector electrode side) has the enhancement n-channel MOSFET structure as in the first embodiment. First gate electrode 128 corresponds to one example of the "first control electrode" and first gate insulating film 127 corresponds to one example of the "first gate insulating film."

A first gate channel region 136 is formed in a region in p base 122 between n base 121 and n emitter 123. In first gate channel region 136, a current path (channel) is formed or disappears in accordance with first gate voltage Vg1 applied to first gate electrode 128 with emitter electrode 130 being defined as the reference, as in the first embodiment. Since a behavior of first gate channel region 136 in response to first gate voltage Vg1 is the same as the behavior of first gate channel region 56 in the first embodiment, detailed description will not be repeated.

P collector 124 is disposed in the second main surface of n base 121. P collector 124 corresponds to one example of the "fourth semiconductor layer." N collector 132 at a high concentration is selectively disposed in the surface (on the second main surface side) of p collector 124 for establishing good Ohmic contact with collector electrode 131 and corresponds to one example of the "fifth semiconductor layer." Collector electrode 131 is disposed on p collector 124 and n collector 132 (on the second surface side) and arranged on the second ma in surface of semiconductor device 200b. Collector electrode 131 corresponds to one example of the "second main electrode."

Second gate electrode 134 is isolated from collector electrode 131 by a second gate interlayer insulating film 135. A second gate channel region 133 identical in conductivity type (n-type) to n collector 132 and n base 121 is provided between n collector 132 and n base 121. P-type semiconductor region 137 is disposed between second gate electrode 134 and n collector 132 and electrically disconnects second gate channel region 133 and second gate electrode 134 from each other. P-type semiconductor region 137 corresponds to one example of the "eighth semiconductor layer" and second gate channel region 133 is isolated by p-type semiconductor region 137 from second gate electrode 134 without disposing second gate insulating film 57 in FIG. 5.

A second gate portion on the collector side has an n-channel JFET structure and has a normally-on characteristic. In order to electrically disconnect n collector 132 and n base 121 from each other by turning off the n-channel JFET, a voltage negative with respect to collector electrode 131 should be applied to second gate electrode 134 to deplete second gate channel region 133 to increase a resistance. When application of a negative voltage to second gate electrode 134 is stopped or a positive voltage is applied thereto, second gate channel region 133 renders n collector 132 and n base 121 electrically conducting to each other. Therefore, a behavior of second gate channel region 133 in response to second gate voltage Vg2 is the same as the behavior of second gate channel region 53 in the first embodiment. Second gate electrode 134 corresponds to one example of the "second control electrode."

Therefore, turn-on and turn-off of semiconductor device 200b according to the second example of the second embodiment can also be controlled by controlling first gate voltage Vg1 and second gate voltage Vg2 as in the first embodiment and the modification thereof.

According to semiconductor device 200b according to the second example of the second embodiment, a gate insulating film (second gate insulating film 57 in FIG. 5) does not have to be formed between second gate electrode 134 and an interface of a semiconductor in the second gate portion on the second main surface side. Therefore, since semiconductor device 200b can be manufactured without performing a step of forming a gate insulating film, it can be manufactured more easily than semiconductor device 200 according to the first embodiment including second gate insulating film 57.

Third Example

Figure 34:
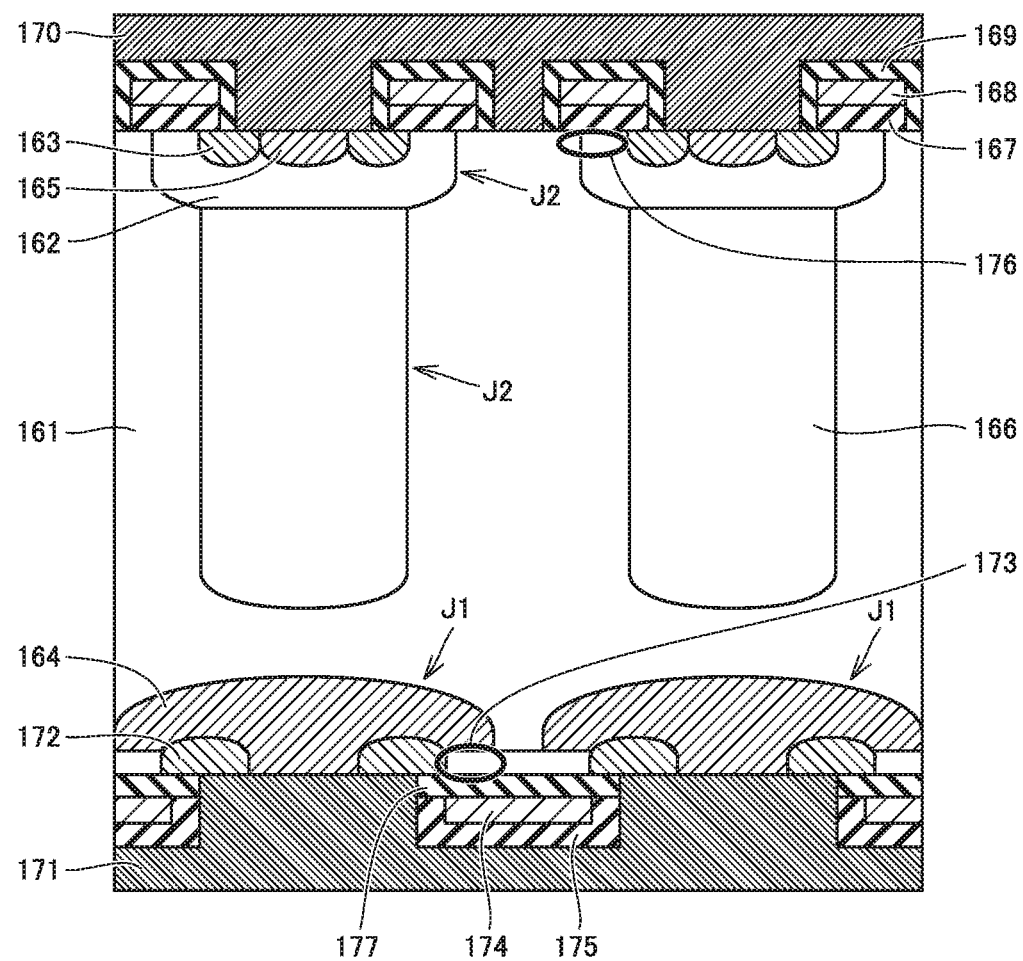
FIG. 34 is a partial cross-sectional view of a semiconductor device according to a third example of the second embodiment.

FIG. 34 is a partial cross-sectional view of a semiconductor device of the double-gate structure according to a third example of the second embodiment. Referring to FIG. 34, in a semiconductor device 200c according to the third example of the second embodiment, similarly to the double-gate structure according to the first embodiment, the first gate on the first main surface (emitter electrode) side has the enhancement n-channel MOSFET structure and the second gate on the second main surface (collector electrode) side has the depression n-channel MOSFET structure.

Semiconductor device 200c includes an n base 161 including first and second main surfaces, a p base 162, an n emitter 163, a p collector 164, a p emitter 165, a p base pillar 166, a first gate insulating film 167, a first gate electrode 168, a first gate interlayer insulating film 169, an emitter electrode 170, a collector electrode 171, an n collector 172, a second gate electrode 174, a second gate interlayer insulating film 175, and a second gate insulating film 177.

N base 161 corresponds to one example of the "first semiconductor layer," and also in semiconductor device 200c, the n-type corresponds to the "first conductivity type" and the p-type corresponds to the "second conductivity type." P base 162 is disposed on the first main surface of n base 161 and corresponds to one example of the "second semiconductor layer." N emitter 163 is selectively disposed in a surface of p base 162 and corresponds to one example of the "third semiconductor layer." P emitter 165 at a high concentration is selectively provided in the surface (on the first main surface side) of p base 162 for establishing good Ohmic contact with emitter electrode 170. P base pillar 166 is disposed as a p-type semiconductor region which deeply enters n base 161 from p base 162.

Emitter electrode 170 is disposed on the upper surface (on the first main surface side) of p base 162 and n emitter 163 and arranged on the first main surface of semiconductor device 200c. Emitter electrode 170 corresponds to one example of the "first main electrode."

In the first main surface, a first gate channel region 176 is formed by first gate insulating film 167, first gate electrode 168, and first gate interlayer insulating film 169, in a region between n base 161 and n emitter 163 in p base 162 where a first gate of a planar gate structure is provided. In first gate channel region 176, as in the first embodiment, a current path (channel) is formed or not formed in accordance with first gate voltage Vg1 applied to first gate electrode 168 with emitter electrode 170 being defined as the reference. Since a behavior of first gate channel region 176 in response to first gate voltage Vg1 is the same as the behavior of first gate channel region 56 in the first embodiment, detailed description will not be repeated. First gate electrode 168 corresponds to one example of the "first control electrode" and first gate insulating film 167 corresponds to one example of the "first gate insulating film."

P collector 164 is disposed in the second main surface of n base 161. P collector 164 corresponds to one example of the "fourth semiconductor layer." N collector 172 at a high concentration is selectively disposed in the surface (on the second main surface side) of p collector 164 for establishing good Ohmic contact with collector electrode 171 and corresponds to one example of the "fifth semiconductor layer." Collector electrode 171 is disposed on p collector 164 and n collector 172 (on the second main surface side) and arranged on the second main surface of semiconductor device 200c. Collector electrode 171 corresponds to one example of the "second main electrode."

On the second main surface as well, the second gate of the planar gate structure as in semiconductor device 200 according to the first embodiment is provided by second gate electrode 174, second gate interlayer insulating film 175, and second gate insulating film 177. A normally-on second gate channel region 173 is formed in correspondence with the second gate. A behavior of second gate channel region 173 in response to second gate voltage Vg2 is the same as the behavior of second gate channel region 53 in the first embodiment. Second gate electrode 174 corresponds to one example of the "second control electrode" and second gate insulating film 177 corresponds to one example of the "second gate insulating film."

Turn-on and turn-off of semiconductor device 200c according to the third example of the second embodiment can also be controlled by controlling first gate voltage Vg1 and second gate voltage Vg2 as in the first embodiment and the modification thereof.

Semiconductor device 200c according to the third example of the second embodiment has a superjunction structure in which a p-type region deeply enters n base 161. Thus, a PN junction (J2 junction) of n base 161 with p base 162 and p base pillar 166 can be disposed substantially perpendicularly to the first main surface. Consequently, n base 161 can be smaller in thickness and an impurity density in n base 161 can be increased. Semiconductor device 200c can consequently be low in on voltage during the on operation period.

In particular, the structure of semiconductor device 200c is effective to lower an on voltage during a MOSFET operation and to enhance current conduction capability during the MOSFET operation. On the other hand, when semiconductor device 200c performs a turn-off operation, there is a concern in particular about lowering in turn-off switching performance (voltage capability) due to partially non-uniform operations in depleting the J2 junction large in area in turn-off switching from a high voltage.

In semiconductor device 200c, however, in the turn-off switching operation from the high voltage during the. MOSFET operation, time required for depleting the J2 junction can be controlled by applying a negative voltage to second gate electrode 174 for an appropriate time interval. Therefore, by combining control of second gate voltage Vg2 at the time of turn-off in semiconductor device 200c, an effect of lower loss owing to lowering in on voltage can further be enhanced while lowering in turn-off switching performance described above is avoided.

Third Embodiment

Semiconductor devices 200 and 200a to 200c described in the first and second embodiments are configured to have a parasitic diode embedded between the emitter and the collector. By way of example, a structure of the parasitic diode will be described with reference to semiconductor device 200a (FIG. 32).

Referring again to FIG. 32, in semiconductor device 200a, a parasitic diode implemented by the pn junction (J2 junction) formed by p base 82 and n base 81 is implemented by a path of p emitter 85-p base 82-n base 81 (including n-type charge accumulation layer 98 and n buffer 99)-second gate channel region 93 (n-type)-n collector 92. Since the parasitic diode has p emitter 85 electrically connected to emitter electrode 90 and has n collector 92 electrically connected to collector electrode 91, it is connected in anti-parallel to the IGBT and functions similarly to FWD which secures a path for a reverse current (Ic<0) which flows from emitter electrode 90 to collector electrode 91.

The current path defined by the parasitic diode includes second gate channel region 93 whereas it does not include first gate channel region 96. Therefore, a voltage drop and power loss at the time of passage of the reverse current can be reduced by lowering an electrical resistance of second gate channel region (n-type) 93 by applying second gate voltage Vg2.

Furthermore, in passage of a reverse current, by applying a voltage positive with respect to emitter electrode 90 (Vg1>0) to first gate electrode 88, that is, by turning on the first gate, to invert first gate channel region 96 from the p-type to the n-type while the normally-on second gate remains on (that is, second gate channel region 93 remains as the n-type), a path for a reverse current provided by a semiconductor identical in conductivity type can be defined. Specifically, a reverse current can flow between emitter electrode 90 and collector electrode 91 through a path of n emitter 83-first gate channel region 96 (inverted to the n-type)-n base 81 (including n-type charge accumulation layer 98 and n buffer 99)-second gate channel region 93 (n-type)-n collector 92 in parallel to the current path defined by the parasitic diode.

The path for the reverse current defined by the parasitic diode is not formed unless a reverse bias not lower than a certain level is applied to the pn junction (J2 junction) (for example, Vce≤approximately −0.7 (V)), whereas a current path defined by turn-on of the first gate can be formed also while a reverse bias not lower than a certain level is not applied to the pn junction.

When a reverse current is high, a voltage drop generated by a parasitic resistance in a current path defined by turn-on of the first gate is greater than a voltage drop generated by the parasitic diode including the pn junction. Therefore, by controlling on and off of the first gate in accordance with magnitude of a reverse current, a path of the reverse current can efficiently be secured.

Figure 35:
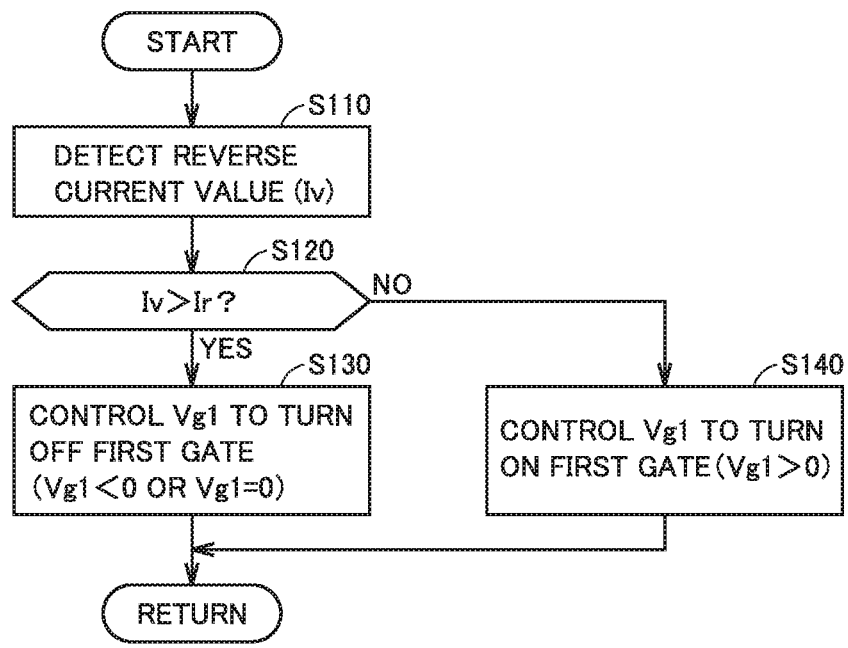
FIG. 35 is a flowchart illustrating gate voltage control according to a third embodiment.

FIG. 35 is a flowchart illustrating gate voltage control according to a third embodiment. First gate voltage Vg1 can be controlled by drive control circuit 300 (FIG. 6) in accordance with the flowchart in FIG. 35.

Referring to FIG. 35, drive control circuit 300 detects a reverse current Iv (Iv=−Ic, Iv>0) in a step (which is simply denoted as "S" below) 110.

Figure 36:
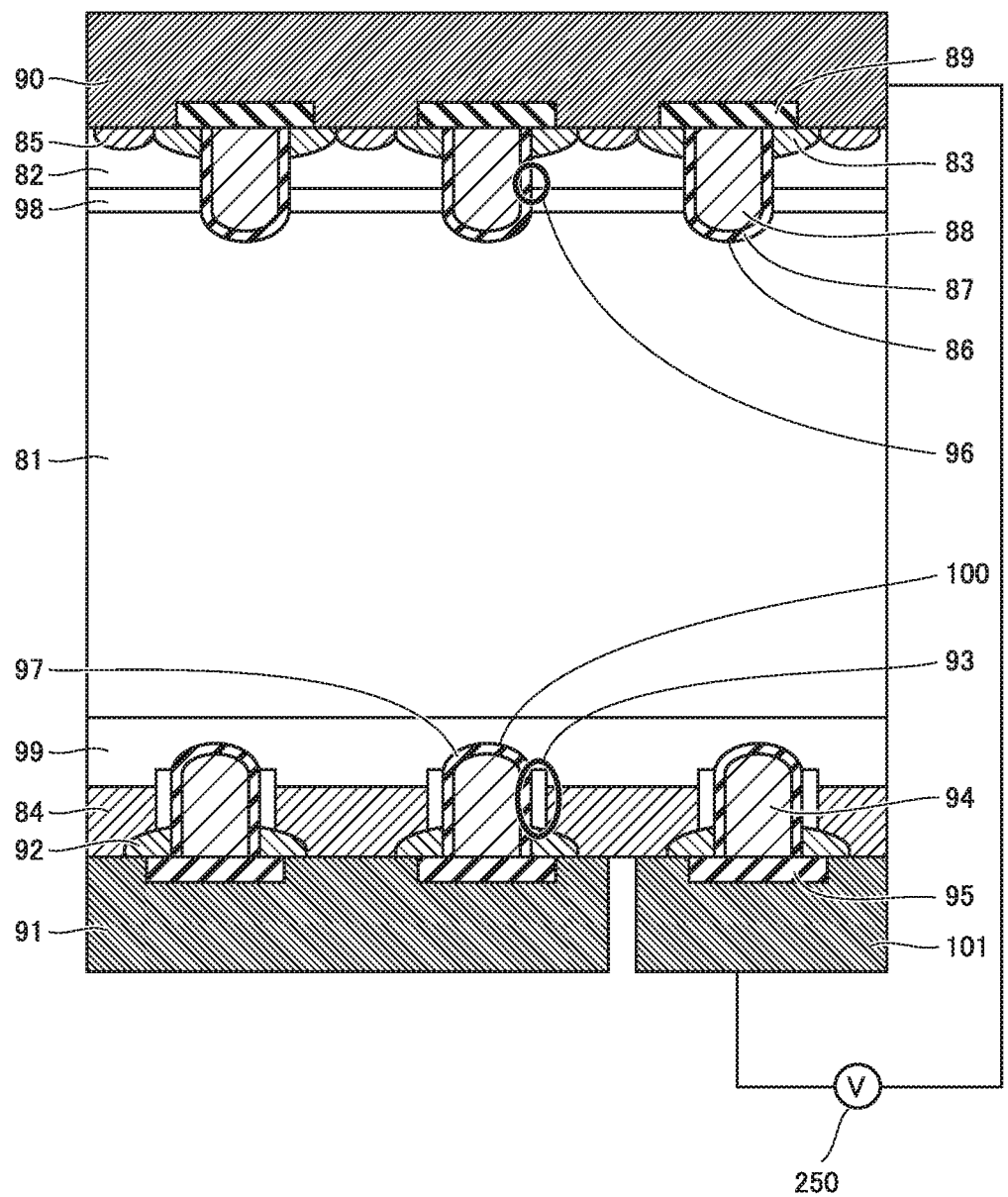
FIG. 36 is a partial cross-sectional view of a semiconductor device for illustrating a configuration for detecting a reverse current.

One example of a configuration for detecting reverse current Iv will be described with reference to FIG. 36. FIG. 36 illustrates a configuration for detecting reverse current Iv in semiconductor device 200a (FIG. 32).

Based on comparison of FIG. 36 with FIG. 32, a collector electrode 101 is further provided on the second main surface of semiconductor device 200a. in addition to collector electrode 91. Collector electrode 101 is disposed on p collector 84 and n collector 92 (on the second main surface side) similarly to collector electrode 91 and arranged on the second main surface of semiconductor device 200a, and corresponds to one example of the "third main electrode." Since FIG. 36 is otherwise the same as FIG. 32 in configuration, detailed description will not be repeated. A voltage detector 250 is further arranged between emitter electrode 90 and collector electrode 101.

A reverse current which flows from the emitter to the collector is divided into a current which flows from emitter electrode 90 to collector electrode 91 and a current which flows from emitter electrode 90 to collector electrode 101. Since a ratio of current division here is in accordance with a ratio of density in second gate channel region 93 disposed on the second main surface side between collector electrodes 91 and 101, it can be determined in advance as a designed value.

Therefore, voltage detector 250 measures a voltage difference between collector electrode 101 and emitter electrode 90 so that reverse current Iv can equivalently be detected (S110) by calculation for estimating a current by using the ratio of current division and an electrical resistance value (a designed value) in the inside of the IGBT. As described above, since a path for a reverse current different from that defined by the parasitic diode is formed in response to on of the first gate, an electrical resistance value used in calculation for estimating a current is preferably varied in coordination with on and off of the first gate.

Referring again to FIG. 35, in order to be able to detect reverse current Iv (S110) also in a region where a reverse bias voltage is low, the first gate is preferably on at the time of start of gate voltage control in accordance with FIG. 35.

When reverse current Iv is detected (S110), drive control circuit 300 compares reverse current Iv with a predetermined current reference value Ir in S120. When reverse current Iv is equal to or lower than current reference value Ir (determination as NO in S120), first gate voltage Vg1 is controlled to turn on the normally-off first gate in S110. The normally-on second gate is maintained in the on state (for example, Vg2=0). Thus, a path for a reverse current through first gate channel region 96 and second gate channel region 93, including the normally-on second gate, is secured between the emitter and the collector.

When reverse current Iv is greater than current reference value Ir (determination as YES in S120), drive control circuit 300 controls first gate voltage Vg1 to turn off the first gate in S130. As the first gate is turned off, a path for the reverse current through the parasitic diode in the IGBT is secured between the emitter and the collector.

Current reference value Ir in S120 can be determined in advance in correspondence with an amount of a current at which a voltage drop of the parasitic diode when the reverse current flows is comparable to a voltage drop generated in a current path including first gate channel region 96 and second gate channel region 93.

Thus, a high current (Iv>Ir) can be permitted to pass by means of the parasitic diode by using such diode characteristics to pass a high current at a low voltage, whereas a voltage drop of a low current (Iv≤Ir) can be suppressed by using a current path including first gate channel region 96 and second gate channel region 93. Processing in S110 to S140 can repeatedly be performed during the off period of semiconductor device 200a (IGBT).

Therefore, according to gate voltage control according to the third embodiment, a voltage drop in the IGBT caused between the emitter and the collector when a reverse current (Ic<0) passes can be suppressed and hence conduction loss of the reverse current can be reduced.

Though application to semiconductor device 200a is described in the third embodiment, gate voltage control according to the third embodiment can similarly be applied also to semiconductor devices 200 (FIG. 5), 200b (FIG. 33), and 200c (FIG. 34) by providing a configuration for detecting a reverse current in the collector electrode as in FIG. 36.

Modification of Third Embodiment

As described above, in semiconductor devices 200 and 200a to 200c according to the present embodiment, a path tor a reverse current can be secured by using an internal parasitic diode. In this case, when a pn junction which implements the parasitic diode is forward biased, holes are injected from p base 82 into n base 81 and holes and electrons are accumulated in n base 81 in the configuration in FIG. 32, so that a high reverse current can flow. Once the reverse current flows, however, a function to block a reverse voltage achieved by the pn junction cannot be exhibited even after disappearance of the reverse current until excessive holes and electrons accumulated in n base 81 are emitted or disappear as a result of recombination. Therefore, in an application in which a high-frequency operation is required, an FWD should be connected in the outside of the IGBT without allowing an embedded parasitic diode to operate.

Figure 37:
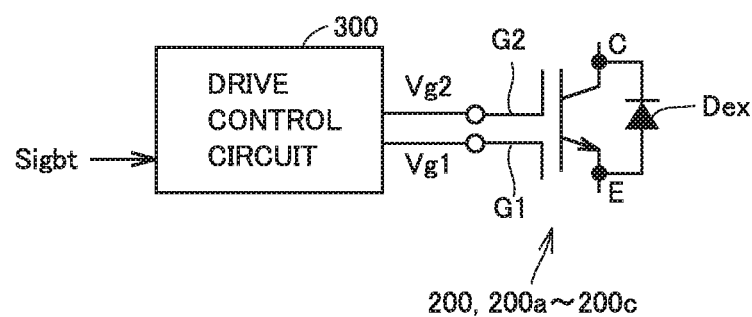
FIG. 37 is a circuit diagram illustrating external connection of a diode in a modification of the third embodiment.

For example, as shown in FIG. 37, a configuration in which a diode element Dex is externally connected in anti-parallel between emitter E and collector C of semiconductor devices 200 and 200a to 200c is applicable to an example in which semiconductor devices 200 and 200a to 200c are turned on and off at a high frequency. For example, a silicon carbide (SiC)-Schattky barrier diode (SBD) capable of a high-speed operation can be employed for such external diode element Dex.

In the configuration in FIG. 37, a parasitic diode in the IGBT described in the third embodiment should be controlled not to perform a diode operation.

Figure 38:
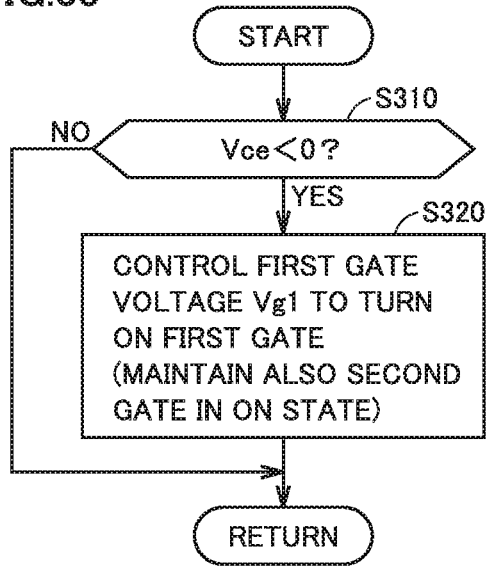
FIG. 38 is a flowchart illustrating gate voltage control according to a modification of the third embodiment.

FIG. 38 is a flowchart illustrating gate voltage control according to a modification of the third embodiment.

Referring to FIG. 38, drive control circuit 300 determines in S310 whether or not a voltage of collector C is lower than a voltage of emitter E, that is, a condition of Vce<0 is satisfied. For example, semiconductor device 200a in FIG. 32 can make determination in S310 based on an output from a voltage sensor which measures a voltage difference between collector electrode 91 and emitter electrode 90.

When the condition of Vce<0 is detected (determination as YES in S310), drive control circuit 300 controls in S320 first gate voltage Vg1 to turn on the normally-off first gate, that is, to form a channel in the first gate channel region. The normally-on second gate is also maintained in the on state (for example, Vg2=0).

Thus, during the off operation period of the IGBT, by maintaining the first and second gates in the on state, a path for a reverse current defined by a semiconductor identical in conductivity type through first gate channel region 96 and second gate channel region 93 described in the third embodiment can be formed in parallel to the embedded parasitic diode. Therefore, a forward bias voltage is less likely to be applied to the pn junction of the parasitic diode embedded in the IGBT and an operation by the parasitic diode can be restricted. When the condition of Vce≥0 is satisfied (determination as NO in S320), first gate voltage Vg1 is not controlled in S320. Processing in S310 and S320 can repeatedly be performed during the off period of semiconductor device 200a (IGBT).

Consequently, according to gate voltage control according to the third embodiment, a reverse current is permitted to pass by means of externally connected high-speed diode element Dex (FIG. 37) instead of an internal parasitic diode so that an operation in causing the semiconductor device to perform a high-frequency operation can be stabilized. Gate voltage control according to the modification of the third embodiment is applicable to semiconductor devices 200 and 200a to 200c in common.

Fourth Embodiment

Semiconductor devices 200 and 200a to 200c of the double-gate structure described in the first and second embodiments perform an operation as if an IGBT and a MOSFET were connected in parallel between the emitter and the collector when the normally-on second gate is turned on. By way of example, a structure of a parasitic diode will be described with reference to semiconductor device 200a (FIG. 32).

Referring again to FIG. 32, when no voltage is applied to second gate electrode 94 on the collector side or when a voltage positive with respect to collector electrode 91 is applied, the second gate is turned on. At this time, an n-channel IGBT structure in which a channel is formed in a part of p base 82 is formed in accordance with first gate voltage Vg1 applied to first gate electrode 88 through p collector 84-n base 81 (including n-type charge accumulation layer 98 and n buffer 99)-p base 82-n emitter 83. An n-channel MOSFET structure in which a channel is formed in a part of p base 82 is formed in parallel to the IGBT structure in accordance with first gate voltage Vg1 of first gate electrode 88, by n collector 92-second gate channel region 93 (n-type)-n base 81 (including n-type charge accumulation layer 98 and n buffer 99)-p base 82-n emitter 83. Such IGBT structure and MOSFET structure are juxtaposed between the collector and the emitter with first gate electrode 88 being defined as a control electrode in common.

While a positive voltage (Vce>0) is applied across the collector and the emitter of semiconductor device 200a, the MOSFET starts to permit a current to flow even with a voltage being very low, when it is turned on by first gate voltage Vg1. Proportional relation with an on resistance Ron being defined as a proportionality coefficient is thus established (V=Ron×I) between the voltage and the current.

On the other hand, in the IGBT, substantially no current flows until the J1 junction which is a pn junction formed by p collector 84 and n base 81 (n buffer 99) on the collector side is forward biased. Once the current starts to flow, however, a current significantly increases with slight increase in voltage. A differential resistance (ΔV/ΔI) expressed as a ratio between an amount of increase in voltage (ΔV) and an amount of increase in current (ΔI) is much lower than on resistance Ron of a MOSFET identical in rating (identical in rated voltage and identical in chip area). Normally, approximately 0.7 (V) is required for forward biasing the J1 junction as described in connection with the diode operation in the third embodiment.

Therefore, in semiconductor device 200a, in a low-voltage operation region where a collector-emitter voltage (Vce) is up to approximately 0.7 (V), an on voltage is lower as a collector current flows owing to a MOSFET operation. In other words, in a region where collector current Ic is low, conduction loss is lower during the MOSFET operation. In a region where collector current k is high, on the other hand, an on voltage is lower and conduction loss is also lower during the MOSFET operation.

Figure 39:
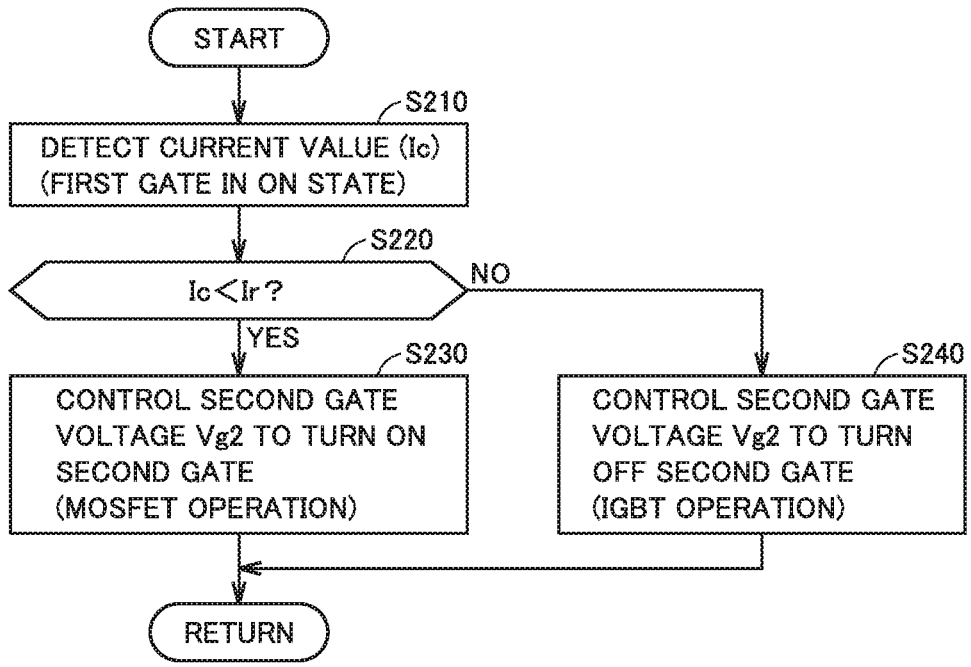
FIG. 39 is a flowchart illustrating gate voltage control according to a fourth embodiment.

FIG. 39 is a flowchart illustrating gate voltage control according to a fourth embodiment. Drive control circuit 300 (FIG. 6) can repeatedly control second gate voltage Vg2 in accordance with the flowchart in FIG. 39 after first gate voltage Vg1 for turning on semiconductor device 200a is applied.

Referring to FIG. 39, drive control circuit 300 detects in S210 collector current Ic while the first gate is turned on, based on an output value front a current detection resistor or a Rogowski coil described with reference to FIG. 6.

Drive control circuit 300 compares detected collector current Ic with predetermined current reference value Ir in S220. Since current reference value Ir is determined in correspondence with a threshold value when an embedded pn junction is forward biased as in the example of the parasitic diode described in the third embodiment, it can be equal to the value in the third embodiment.

When collector current Ic is lower than current reference value Ir (determination as YES in S220), drive control circuit 300 controls second gate voltage Vg2 to turn on the second gate in S230 (Vg2=0 or Vg2>0). By stopping generation of second gate voltage Vg2 for riot forming a channel in the second gate channel region to turn on the second gate, semiconductor device 200a operates to allow a collector current to flow by performing the MOSFET operation.

When collector current Ic is equal to or higher than current reference value Ir (determination as NO in S220), drive control circuit 300 turns off the second gate as in a normal turn-on operation (FIG. 12) in S240. Namely, the drive control circuit controls second gate voltage Vg2 not to form a channel in the second gate channel region (Vg2<0). As the second gate is turned off. semiconductor device 200a operates to allow a collector current to flow by performing the IGBT operation.

According to gate voltage control according to the fourth embodiment, for example, in an application in which a level of an output current (collector current) is varied, switching between the MOSFET operation and the IGBT operation can be made to lower an on voltage in accordance with a current level. In particular, in an application for outputting a low current, conduction loss due to lowering in on voltage can be suppressed. Gate voltage control according to the fourth embodiment is again also applicable to each of semiconductor devices 200 and 200a to 200c in common.

In semiconductor device 200a, with second gate electrode 94 on the collector side having a trench structure, an effect of the MOSFET operation when a current is low is further enhanced. Specifically, since a density in second gate channel region 93 is higher and a total channel resistance is lower as a result of application of the trench structure, a current permitted to flow by performing the MOSFET operation is higher. Thus, when a density of negative charges is higher than an impurity density in second gate channel region 93 as a result of application of a positive voltage to second gate electrode 94, a total channel resistance is further lowered and hence an on voltage in the MOSFET operation can further be lowered.

Fifth Embodiment

When an excessively high current is generated in a path due to a short-circuiting accident in a load or the like in an example where the semiconductor device (IGBT) described in the first and second embodiments is applied, the load and the IGBT may be damaged. Therefore, when a flow of an excessively high current in a semiconductor device (IGBT) is sensed, normally as a self-protection function, drive control circuit 300 automatically turns off the semiconductor device. A path for an overcurrent can thus be cut off and damage to an apparatus can be prevented.

When an overcurrent is cut off, rate of change in current dIc/dt may increase and may also exceed a rate of change several times as high as the rate of change at the time of normal turn-off. Therefore, there is a concern about increase in surge voltage depending on a product between inductance L of a reactor load and dIc/dt at the time of cut-off of the overcurrent. When the surge voltage at this time exceeds withstand voltage capability, there is a concern about destruction of the semiconductor device.

In a fifth embodiment, gate voltage control for self-protection at the time of detection of an overcurrent in the semiconductor device described in the first and second embodiments will be described.

A switching operation for suppressing a surge voltage in semiconductor device 200a will be described with reference again to FIG. 32. During the on operation period before detection of an overcurrent, electrons are excessively accumulated in n base 81. In order to lower the surge voltage at the time of turn-off, dIc/dt can be suppressed by lowering a rate of emission and disappearance of excessive electrons accumulated in n base 81.

Therefore, before and after disappearance of a channel in first gate channel region 96 by turning off the first gate, the second gate is maintained in the off state to cut off a path for emission of excessive electrons in n base 81 to collector electrode 91 through second gate channel region 93, so that dIc/dt can be suppressed. Furthermore, dIc/dt can be suppressed also by continuing injection of holes from p collector 84 into n base 81.

Figure 40:
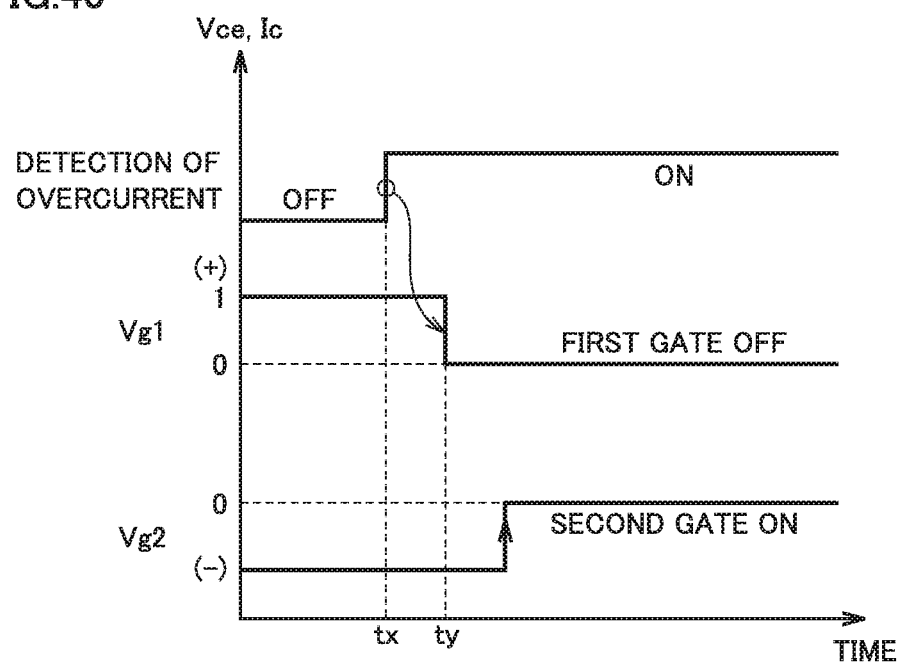
FIG. 40 is an operation waveform diagram illustrating gate voltage control according to a fifth embodiment.

FIG. 40 is an operation waveform diagram illustrating gate voltage control according to the fifth embodiment.

Referring to FIG. 40, when an overcurrent is detected based on a detected value of collector current Ic exceeding a predetermined current upper limit value at time tx during the on operation period of semiconductor device 200a, the self-protection function is activated so that drive control circuit 300 automatically turns off semiconductor device 200a. During the on operation period, first gate voltage Vg1 is set to Vg1=α (V) to turn on the first gate, whereas second gate voltage Vg2 is set to Vg2=−β (V) to turn off the second gate. This state corresponds to the IGBT operation suitable for a high current described in the fourth embodiment.

Drive control circuit 300 controls first gate voltage Vg1 to turn off the first gate at time ty in response to detection of the overcurrent at time tx. For example, at time ty, the first gate voltage is varied to Vg1=0. At time ty, on the other hand, second gate voltage Vg2 is controlled to maintain the second gate in the off state. For example, second gate voltage Vg2 is maintained at Vg2=−β (V).

Second gate voltage Vg2 is controlled to turn on the second gate after time ty. For example, when a predetermined time period has elapsed since time ty, drive control, circuit 300 varies second gate voltage Vg2 from −β (V) to 0 (V). Thus, when an overcurrent is detected, a time lag is set after stop of generation of first gate voltage Vg1 for forming a channel in the first gate channel region. Then, generation of second gate voltage Vg2 for not forming a channel in the second gate channel region is stopped.

Consequently, according to gate voltage control according to the fifth embodiment, destruction of the IGBT can be prevented by lowering dIc/dt and the surge voltage by cutting of the overcurrent in turning off the semiconductor device (IGBT) for self-protection in response to detection of the overcurrent. Gate voltage control according to the fifth embodiment is applicable to semiconductor devices 200 to 200a to 200c in common.

Though embodiments of the present invention have been described, it should be understood that the embodiments disclosed herein are illustrative and non-restrictive in every respect. The scope of the present invention is defined by the terms of the claims and is intended to include any modifications within the scope and meaning equivalent to the terms of the claims.

What is claimed is:

1. A semiconductor device comprising:
a first semiconductor layer of a first conductivity type including first and second main surfaces;
a second semiconductor layer of a second conductivity type disposed on the first main surface of the first semiconductor layer;
a third semiconductor layer of the first conductivity type selectively disposed in a surface of the second semiconductor layer;
a first main electrode on a side of the first main surface disposed on the second semiconductor layer and the third semiconductor layer;
a first gate channel region formed in a region in the second semiconductor layer, between the first semiconductor layer and the third semiconductor layer;
a first control electrode isolated from the first gate channel region by a first gate insulating film;
a fourth semiconductor layer of the second conductivity type disposed in the second main surface of the first semiconductor layer;
a fifth semiconductor layer of the first conductivity type selectively disposed in a surface of the fourth semiconductor layer;
a second main electrode on a side of the second main surface disposed on the fourth semiconductor layer and the fifth semiconductor layer;
a second gate channel region of the first conductivity type provided between the first semiconductor layer and the fifth semiconductor layer; and
a second control electrode isolated from the second gate channel region by a second gate insulating film.

2. The semiconductor device according to claim 1, wherein
an n-type is defined as the first conductivity type and a p-type is defined as the second conductivity type,
the first gate channel region is configured to be normally off such that a channel is formed between the first semiconductor layer and the third semiconductor layer by application of a voltage positive with respect to the first main electrode to the first control electrode, and
the second gate channel region is configured to be normally on such that no channel between the first semiconductor layer and the fifth semiconductor layer is formed by application of a voltage negative with respect to the second main electrode to the second control electrode.

3. The semiconductor device according to claim 1, further comprising a first trench provided on the side of the first main surface to reach the first semiconductor layer through the third semiconductor layer and the second semiconductor layer, wherein the first gate insulating film is formed on a surface of the first trench, and the first control electrode is formed on the first gate insulating film within the first trench.

4. The semiconductor device according to claim 1, further comprising a sixth semiconductor layer of the first conductivity type disposed between the first semiconductor layer and the second semiconductor layer, wherein the sixth semiconductor layer is formed as being higher in impurity density than the first semiconductor layer and smaller in thickness than the second semiconductor layer.

5. The semiconductor device according to claim 1, further comprising a seventh semiconductor layer of the first conductivity type disposed between the first semiconductor layer and the fourth semiconductor layer, wherein the seventh semiconductor layer is Conned as being higher in impurity density than the first semiconductor layer and greater in thickness than the fourth semiconductor layer, and the second gate channel region is provided between the seventh semiconductor layer and the fifth semiconductor layer.

6. The semiconductor device according to claim 1, further comprising a second trench provided on tire side of the second main surface to reach the first semiconductor layer through the fifth semiconductor layer and the second gate channel region, wherein the second gate insulating film is formed on a surface of the second trench, and the second control electrode is formed on the second gate insulating film within the second trench.

7. The semiconductor device according to claim 5, further comprising a second trench provided on the side of the second main surface to reach the seventh semiconductor layer through the fifth semiconductor layer and the second gale channel region but not to reach the first semiconductor layer, wherein the second gate insulating film is formed on a surface of the second trench, and the second control electrode is formed on the second gate insulating film within the second trench.

8. The semiconductor device according to claim 1, further comprising an eighth semiconductor layer of the second conductivity type connected between the second control electrode and the second gate channel region, wherein the second control electrode is isolated from the second gate channel region by the eighth semiconductor layer instead of the second gate insulating film.

9. The semiconductor device according to claim 1, wherein the second gate insulating film is formed between the second control electrode and the second gate channel region.

10. The semiconductor device according to claim 1, further comprising:

a third main electrode disposed on the fourth semiconductor layer and the fifth semiconductor layer as being separate from the second main electrode, on the side of the second main surface; and a voltage detector configured to measure a voltage difference between the first main electrode and the third main electrode.

11. The semiconductor device according to claim 10, further comprising a drive control circuit configured to control a first gate voltage of the first control electrode and a second gate voltage of the second control electrode, wherein the drive control circuit is configured to measure a reverse current which flows from the first main electrode to the second main electrode owing to the voltage difference detected by the voltage defector during an off operation period in which a flow of a current from the second main electrode to the first main electrode is cut off, control, when the reverse current is higher than a predetermined reference value, the first gate voltage not to form a channel in the first gate channel region, and control, when the reverse current is lower than the reference value, the first gate voltage to form a channel in the first gate channel region.

12. The semiconductor device according to claim 1, further comprising a drive control circuit configured to control a first gate voltage of the first control electrode and a second gate voltage of the second control electrode, wherein the drive control circuit is configured to generate the second gate voltage for not forming a channel in the second gate channel region simultaneously with or immediately before generation of the first gate voltage for forming a channel in the first gate channel region in a first switching operation in which transition from a state that a flow of a current from the second main electrode to the first main electrode is cut off to a state that a current flows from the second main electrode to the first main electrode is made.

13. The semiconductor device according to claim 1, further comprising a drive control circuit configured to control a first gate voltage of the first control electrode and a second gate voltage of the second control electrode, wherein the drive control circuit is configured to stop generation of the second gate voltage for not forming a channel in the second gate channel region simultaneously with or immediately before stop of generation of the first gate voltage for forming a channel in the first gate channel region in a second switching operation in which transition from a state that a current flows from the second main electrode to the first main electrode to a state that flow of a current from the second main electrode to the first main electrode is cut off is made.

14. The semiconductor device according to claim 12, wherein in the first switching operation, the drive control circuit provides at least one period in which generation of the second gate voltage for not forming a channel in the second gate channel region is stopped during a period in which the first gate voltage for forming a channel in the first gate channel region is generated.

15. The semiconductor device according to claim 12, wherein in the first switching operation, the drive control circuit provides at least one period in which generation of the first gate voltage for forming a channel in the first gate channel region is stopped.

16. The semiconductor device according to claim 13, wherein in the second switching operation, the drive control circuit provides at least one period in which the second gate voltage for not forming a channel in the second gate channel region is generated after stop of generation of the first gate voltage for forming a channel in the first gate channel region and the second gate voltage for not forming a channel in the second gate channel region.

17. The semiconductor device according to claim 13, wherein in the second switching operation, the drive control circuit provides at least one period in which the first gate voltage identical in polarity to the first gate voltage for forming a channel in the first gate channel region is generated after stop of generation of the first gate voltage for forming a channel in the first gate channel region and the second gate voltage for not forming a channel in the second gate channel region.

18. The semiconductor device according to claim 12, wherein the first gate voltage generated by the drive control circuit for forming a channel in the first gate channel region and the second gate voltage generated by the drive control circuit for not forming a channel in the second gate channel region are opposite to each other in polarity and equal to each other in absolute value.

19. The semiconductor device according to claim 12, wherein the drive control circuit provides both of a period in which the second gate voltage opposite in polarity to the second gate voltage for not forming a channel in the second gate channel region is generated and a period in which the second gate voltage as high as a voltage of the second main electrode is generated while a flow of a current from the second main electrode to the first main electrode is cut off.

20. The semiconductor device according to claim 12, wherein the drive control circuit generates the second gate voltage for not forming a channel in the second gate channel region while a current flows from the second main electrode to the first main electrode.

21. The semiconductor device according to claim 12, wherein the drive control circuit generates across the first main electrode and the second main electrode, the first gate voltage for forming a channel in the first gate channel region when a voltage of the first main electrode is higher than a voltage of the second main electrode, in a case where a rectifier element is electrically connected with a direction of current conduction from the first main electrode to the second main electrode being defined as a forward direction.

22. The semiconductor device according to claim 12, wherein the drive control circuit stops generation of the second gate voltage for not forming a channel in the second gate channel region when a value of a current which flows from the second main electrode to the first main electrode is smaller than a predetermined current reference value, while the current flows from the second main electrode to the first main electrode.

23. The semiconductor device according to claim 12, wherein the drive control circuit establishes a state that a flow of a current from the second main electrode to the first main electrode is cut off by stopping generation of the second gate voltage for not forming a channel in the second gate channel region after stop of generation of the first gate voltage for forming a channel in the first gate channel region, when a value of a current which flows from the second main electrode to the first main electrode exceeds a predetermined current upper limit value, while the current flows from the second main electrode to the first main electrode.

* * * * *